US007122883B2

(12) United States Patent
Masuda et al.

(10) Patent No.: US 7,122,883 B2
(45) Date of Patent: Oct. 17, 2006

(54) STACKED SEMICONDUCTOR DEVICE INCLUDING IMPROVED LEAD FRAME ARRANGEMENT

(75) Inventors: Masachika Masuda, Tokorozawa (JP); Tamaki Wada, Higashimurayama (JP); Michiaki Sugiyama, Tokyo (JP); Hirotaka Nishizawa, Kokubunji (JP); Toshio Sugano, Kodaira (JP); Yasushi Takahashi, Urawa (JP); Masayasu Kawamura, Higashiyamato (JP)

(73) Assignees: Hitachi, Ltd., Tokyo (JP); Hitachi Ulsi Systems Co., Ltd., Tokyo (JP)

( * ) Notice: Subject to any disclaimer, the term of this patent is extended or adjusted under 35 U.S.C. 154(b) by 159 days.

(21) Appl. No.: 11/002,247

(22) Filed: Dec. 3, 2004

(65) Prior Publication Data

US 2005/0094433 A1 May 5, 2005

Related U.S. Application Data

(63) Continuation of application No. 10/377,713, filed on Mar. 4, 2003, now Pat. No. 7,012,321, which is a continuation of application No. 10/103,775, filed on Mar. 25, 2002, now Pat. No. 6,555,918, which is a continuation of application No. 09/854,626, filed on May 15, 2001, now Pat. No. 6,383,845, which is a continuation of application No. 09/161,725, filed on Sep. 29, 1998, now Pat. No. 6,252,299.

(30) Foreign Application Priority Data

Sep. 29, 1997 (JP) .................................. 9-263434
May 22, 1998 (JP) ................................ 10-140878

(51) Int. Cl.
*H01L 23/495* (2006.01)

(52) U.S. Cl. ................................................... 257/672

(58) Field of Classification Search ................. 257/672
See application file for complete search history.

(56) References Cited

U.S. PATENT DOCUMENTS

| 4,028,722 A | 6/1977 | Heida |
| 5,227,995 A | 7/1993 | Klink et al. |
| 5,296,737 A | 3/1994 | Nishimura et al. |

(Continued)

FOREIGN PATENT DOCUMENTS

JP 2-246125 10/1990

(Continued)

OTHER PUBLICATIONS

U.S. Appl. No. 09/453,171, filed Dec. 2, 1999.

*Primary Examiner*—Carl Whitehead, Jr.
*Assistant Examiner*—Monica D. Harrison
(74) *Attorney, Agent, or Firm*—Antonelli, Terry, Stout and Kraus, LLP.

(57) ABSTRACT

A semiconductor device comprising a resin mold, two semiconductor chips positioned inside the resin mold and having front and back surfaces and external terminals formed on the front surfaces, and leads extending from the inside to the outside of the resin mold, wherein each of said leads is branched into two branch leads in at least the resin mold, the one branch lead is secured to the surface of the one semiconductor chip and is electrically connected to an external terminal on the surface thereof through a wire, the other branch lead is secured to the surface of the other semiconductor chip and is electrically connected to an external terminal on the surface thereof through a wire, and the two semiconductor chips are stacked one upon the other, with their back surfaces opposed to each other.

8 Claims, 25 Drawing Sheets

U.S. PATENT DOCUMENTS

| | | |
|---|---|---|
| 5,299,092 A | 3/1994 | Yaguchi et al. |
| 5,331,235 A | 7/1994 | Chun |
| 5,463,253 A | 10/1995 | Waki et al. |
| 5,491,612 A | 2/1996 | Nicewarner, Jr. |
| 5,508,565 A | 4/1996 | Hatakeyama et al. |
| 5,530,292 A | 6/1996 | Waki et al. |
| 5,543,658 A | 8/1996 | Hosokawa et al. |
| 5,572,068 A | 11/1996 | Chun |
| 5,627,828 A | 5/1997 | Lee |
| 5,646,446 A | 7/1997 | Nicewarner, Jr. et al. |
| 5,677,569 A | 10/1997 | Choi et al. |
| 5,744,862 A | 4/1998 | Ishii |
| 5,757,080 A | 5/1998 | Sota |
| 5,776,797 A | 7/1998 | Nicewarner, Jr. et al. |
| 5,814,881 A | 9/1998 | Alagaratnam et al. |
| 5,917,242 A | 6/1999 | Ball |
| 5,939,779 A | 8/1999 | Kim |
| 6,046,504 A | 4/2000 | Kimura |
| 6,118,176 A | 9/2000 | Tao et al. |

FOREIGN PATENT DOCUMENTS

| | | |
|---|---|---|
| JP | 7-58281 | 3/1995 |
| JP | 786526 | 3/1995 |

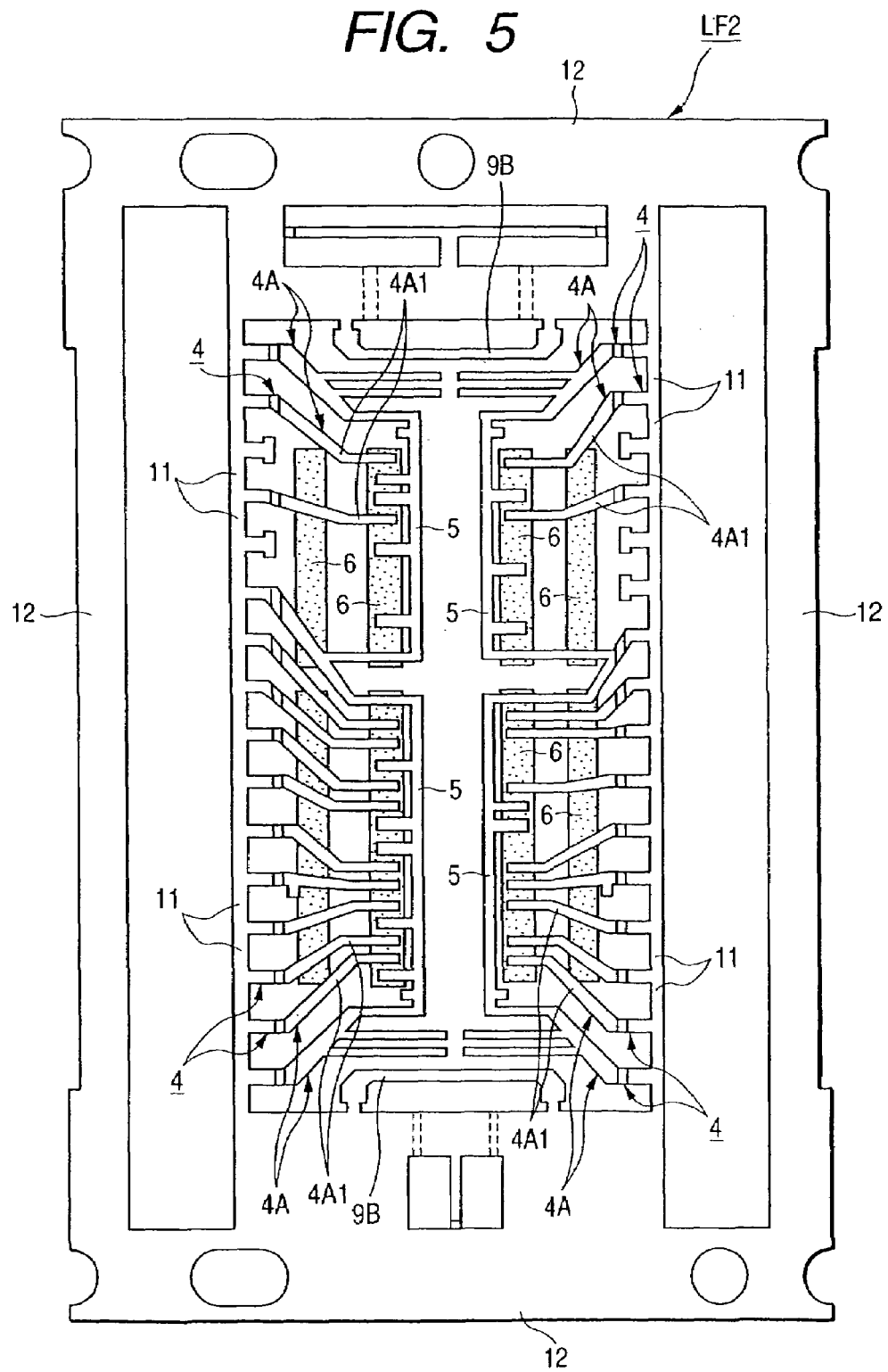

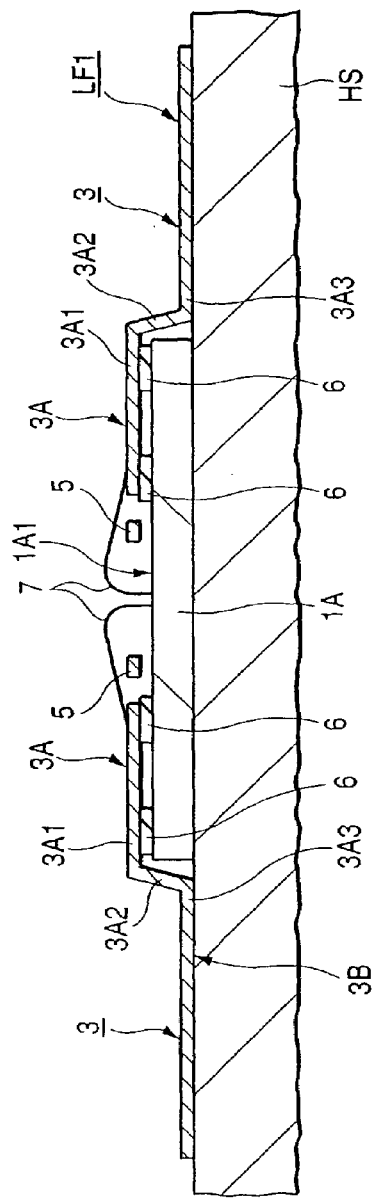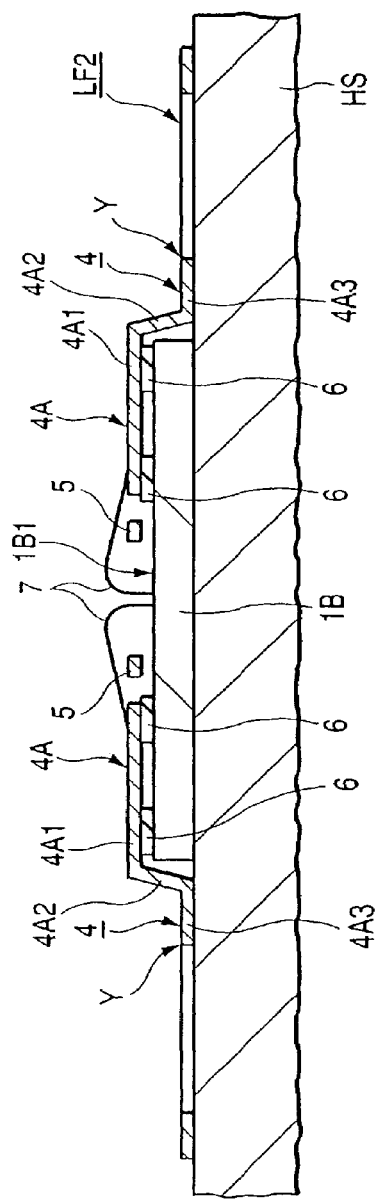

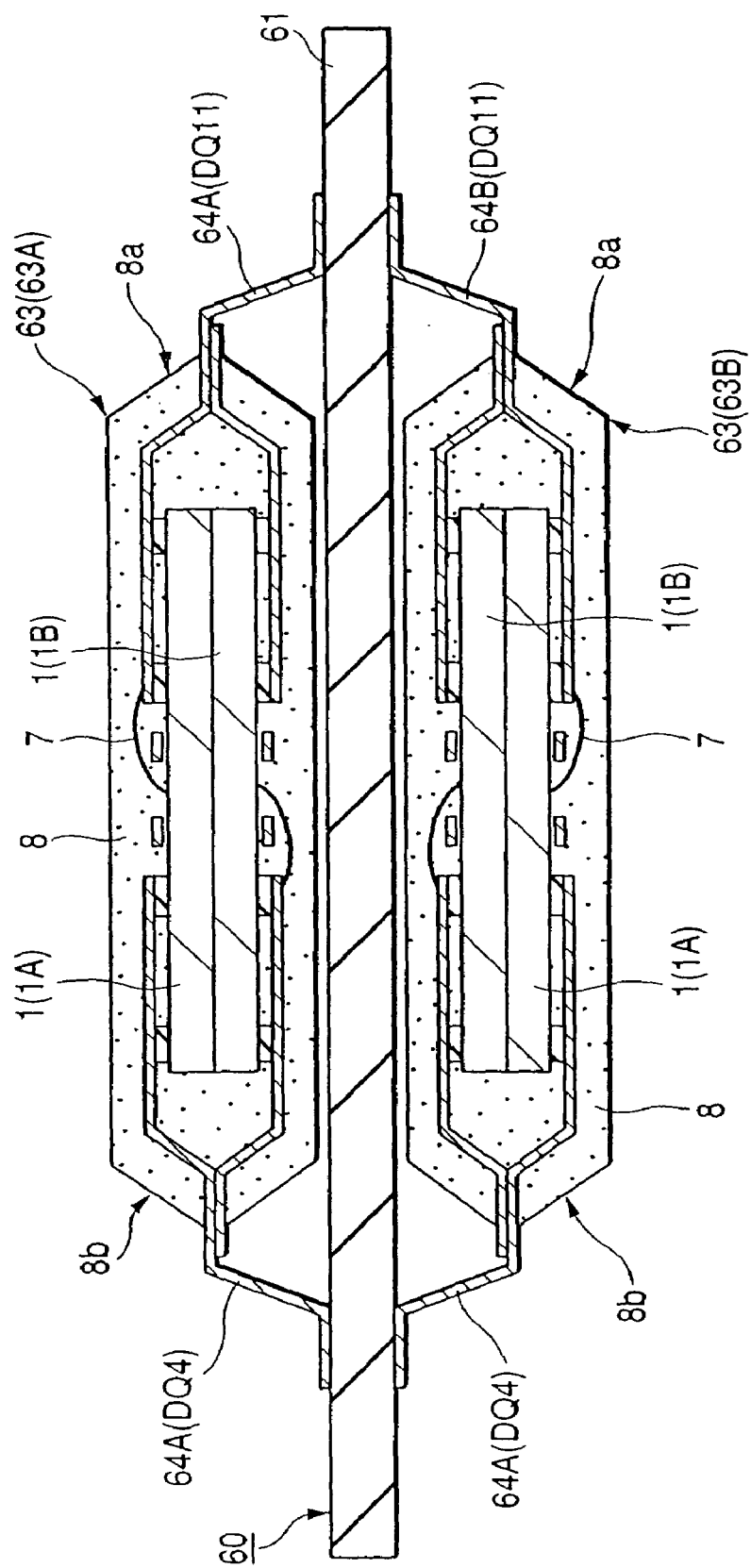

STACKED SEMICONDUCTOR DEVICE INCLUDING IMPROVED LEAD FRAME ARRANGEMENT

CROSS-REFERENCE TO RELATED APPLICATIONS

This is a Continuation of application Ser. No. 10/377,713, filed Mar. 4, 2003, now U.S. Pat. No. 7,012,321 which is a Continuation of application Ser. No. 10/103,775, filed Mar. 25, 2002 (now U.S. Pat. No. 6,555,918), which is a Continuation of application Ser. No. 09/854,626, filed May 15, 2001 (now U.S. Pat. No. 6,383,845); which is a Continuation of application Ser. No. 09/161,725, filed Sep. 29, 1998 (now U.S. Pat. No. 6,252,299), and relates to application Ser. No. 09/453,171, filed Dec. 2, 1999, the entire disclosures of which are hereby incorporated by reference.

BACKGROUND OF THE INVENTION

The present invention relates to a semiconductor device and, more particularly, to a technology that can be effectively adapted to a semiconductor device in which two semiconductor chips are stacked one upon the other and are molded with a resin.

In a semiconductor device in which a semiconductor chip constituting a DRAM (dynamic random access memory) is molded with a resin, there has been employed an LOC (lead on chip) structure which can be applied to a semiconductor chip of even a large size, thereby eliminating die pads (also referred to as tabs) of the lead frame. A semiconductor device employing a LOC structure has been disclosed in, for example, Japanese Patent Laid-Open No. 2-246125/1990 (laid open on Oct. 1, 1990).

In order to accomplish a large capacity, there has been developed a semiconductor device employing a LOC structure; i.e., in which two semiconductor chips constituting DRAMs of the same capacity are stacked one upon the other and are molded with the same resin.

The above semiconductor device is constituted by a resin mold, two semiconductor chips positioned inside the resin mold and having external terminals on the circuit-forming surfaces thereof, which are the front surfaces out of the front surfaces and the back surfaces, and leads extending from the inside to the outside of the resin mold. The two semiconductor chips are stacked one upon the other in a state where the circuit-forming surfaces are opposed to each other. Each lead has two branch leads branched in the up-and-down direction in the resin mold. The one branch lead is adhered and secured, via an insulating film, to the circuit-forming surface of the one semiconductor chip and is electrically connected, via an electrically conductive wire, to an external terminal of the circuit-forming surface. The other branch lead is adhered and secured, via an insulating film, to the circuit-forming surface of the other semiconductor chip and is electrically connected, via an electrically conductive wire, to an external terminal of the circuit-forming surface.

The two branch leads are constituted by separate members. The one branch lead is led to the outside of the resin mold and is integrated with an external lead formed in a predetermined shape. The other branch lead is joined to the one branch lead in the resin mold and is electrically and mechanically connected thereto. That is, the lead extending from the inside to the outside of the resin mold is constituted by an external lead led to the outside of the resin mold, the one branch lead integral with the external lead, and the other branch lead joined to the one branch lead.

The above-mentioned semiconductor device has been disclosed in, for example, Japanese Patent Laid-Open No. 7-58281/1995 (laid open on Mar. 3, 1995).

SUMMARY OF THE INVENTION

In the above-mentioned semiconductor device, the two semiconductor chips are stacked one upon the other in a state where the circuit-forming surfaces are opposed to each other. Therefore, the two branch leads branched in the up-and-down direction are present between the two semiconductor chips in the resin mold. The two branch leads are connected, through wires, to the surfaces (bonding surfaces) opposed to each other and are, hence, spaced away from each other. Therefore, the gap between the two semiconductor chips is widened by an amount corresponding to the gap (distance) between the two branch leads, resulting in an increase in the thickness of the resin mold and an increase in the thickness of the semiconductor device.

Furthermore, the two branch leads are present between the two semiconductor chips. Therefore, a stray capacitance (chip-lead capacitance) produced relative to the one semiconductor chip and a stray capacitance (chip-lead capacitance) produced relative to the other semiconductor chip, are added to the two branch leads. Accordingly, an increased stray capacitance is added to a lead that is extending from the inside to the outside of the resin mold, resulting in a decrease in the propagation speed of signals through the lead and a decrease in the electric characteristics of the semiconductor device.

An object of the present invention is to provide technology capable of decreasing the thickness of a semiconductor device.

Another object of the present invention is to provide a technology capable of improving the electric characteristics of a semiconductor device.

The above and other objects as well as novel features of the present invention will become obvious from the description provided in this specification and from the accompanying drawings.

Briefly described below are representative aspects of the invention disclosed in this application.

(1) A semiconductor device comprising:

a resin mold;

two semiconductor chips positioned inside said resin mold and having external terminals formed on the front surfaces (circuit-forming surfaces) out of the front surfaces and the back surfaces thereof; and leads extending from the inside to the outside of said resin mold; wherein, each of said leads is branched into two branch leads in at least said resin mold;

one branch lead is secured to the surface of said one semiconductor chip and is electrically connected to an external terminal on the surface thereof;

the other branch lead is secured to the surface of said other semiconductor chip and is electrically connected to an external terminal on the surface thereof; and said two semiconductor chips are stacked one upon the other, with their back surfaces opposed to each other.

The one branch lead is electrically connected to an external terminal on the surface of said one semiconductor chip through an electrically conductive wire, and the other branch lead is electrically connected to an external terminal on the surface of said other semiconductor chip through an electrically conductive wire.

Moreover, the one branch lead is adhered and secured to the surface of said one semiconductor chip via an insulating film or an insulating adhesive agent, and the other branch lead is adhered and secured to the surface of said other semiconductor chip via an insulating film or an insulating adhesive agent.

(2) In the semiconductor device described in item (1) above, the back surfaces of the two semiconductor chips are in contact with each other.

(3) In the semiconductor device described in item (1) above, a portion of the one branch lead opposed to the surface of said one semiconductor chip has a thickness smaller than that of the other portions, and a portion of the other branch lead opposed to the surface of said other semiconductor chip has a thickness smaller than that of the other portions.

(4) A semiconductor device comprising:

a resin mold;

two semiconductor chips positioned inside said resin mold and having a plurality of external terminals formed on the front surfaces out of the front surfaces and the back surfaces thereof; and first leads and second leads extending from the inside to the outside of said resin mold; wherein, said two semiconductor chips are stacked one upon the other in a state where their back surfaces are opposed to each other;

said first leads are electrically connected to the external terminals of said two semiconductor chips;

said second leads are electrically connected to the external terminals of either one of said two semiconductor chips;

each said first leads is branched into two branch leads in said resin mold;

said one branch lead is secured to the surface of said one semiconductor chip out of said two semiconductor chips and is electrically connected to an external terminal formed on the surface thereof through an electrically conductive wire;

the other branch lead is secured to the surface of the other semiconductor chip out of said two semiconductor chips and is electrically connected to an external terminal formed on the surface thereof through an electrically conductive wire; and said second leads are secured to the surface of either one of said two semiconductor chips and are electrically connected to external terminals formed on the surface thereof through electrically conductive wires inside said resin mold.

The one branch lead is adhered and secured to the surface of said one semiconductor chip via an insulating film or an insulating adhesive agent, the other branch lead is adhered and secured to the surface of said other semiconductor chip via an insulating film or an insulating adhesive agent, and the second lead is adhered and secured to the surface of either of said two semiconductor chips via an insulating film or an insulating adhesive agent.

With the above-mentioned means (1), the two semiconductor chips are stacked one upon the other in a state where their back surfaces are opposed to each other. Therefore, no branch lead exists between the two semiconductor chips, and the gap between the two semiconductor chips can be decreased, and the thickness of the resin mold can be decreased correspondingly. This makes it possible to decrease the thickness of the semiconductor device.

Besides, the two branch leads do not exist between the two semiconductor chips. Therefore, the stray capacitance produced relative to the other semiconductor chip can be substantially precluded from the stray capacitance (chip-lead capacitance) added to the one branch lead, and the stray capacitance produced relative to the one semiconductor chip can be substantially precluded from the stray capacitance (chip-lead capacitance) added to the other branch lead. Accordingly, a decreased amount of stray capacitance is added to the lead that extends from the inside to the outside of the resin mold. This makes it possible to increase the signal propagation speed through the lead and to improve the electric characteristics of the semiconductor device.

With the above-mentioned item (2), the two semiconductor chips are in contact with each other on their back surfaces, and there is no gap between the two semiconductor chips. Therefore, the thickness of the resin mold can be decreased correspondingly making it possible to further decrease the thickness of the semiconductor device.

With the above-mentioned item (3), it is possible to decrease the thickness of the resin of the resin mold on the surface of the one semiconductor chip and to decrease the thickness of the resin of the resin mold on the surface of the other semiconductor chip. Therefore, the thickness of the resin mold can be decreased correspondingly, and the thickness of the semiconductor device can be further decreased.

With the above-mentioned item (4), the second lead is secured to the surface of either of the two semiconductor chips and is electrically connected to an external terminal formed on the surface thereof through an electrically conductive wire in the resin mold. Therefore, the stray capacitance (chip-lead capacitance) added to the second lead becomes smaller than the stray capacitance (chip-lead capacitance) added to the first lead. Accordingly, the signal propagation speed of the second lead increases, contributing to an improvement in the electric characteristics of the semiconductor device.

BRIEF DESCRIPTION OF THE DRAWINGS

FIG. 5 is a plan view of a lead frame used in the process for producing the semiconductor device;

FIGS. 6(A) and 6(B) are sectional views illustration a method of producing the semiconductor device;

FIG. 28 is a sectional view of the above electronic apparatus.

DESCRIPTION OF THE PREFERRED EMBODIMENTS

Figure 1:
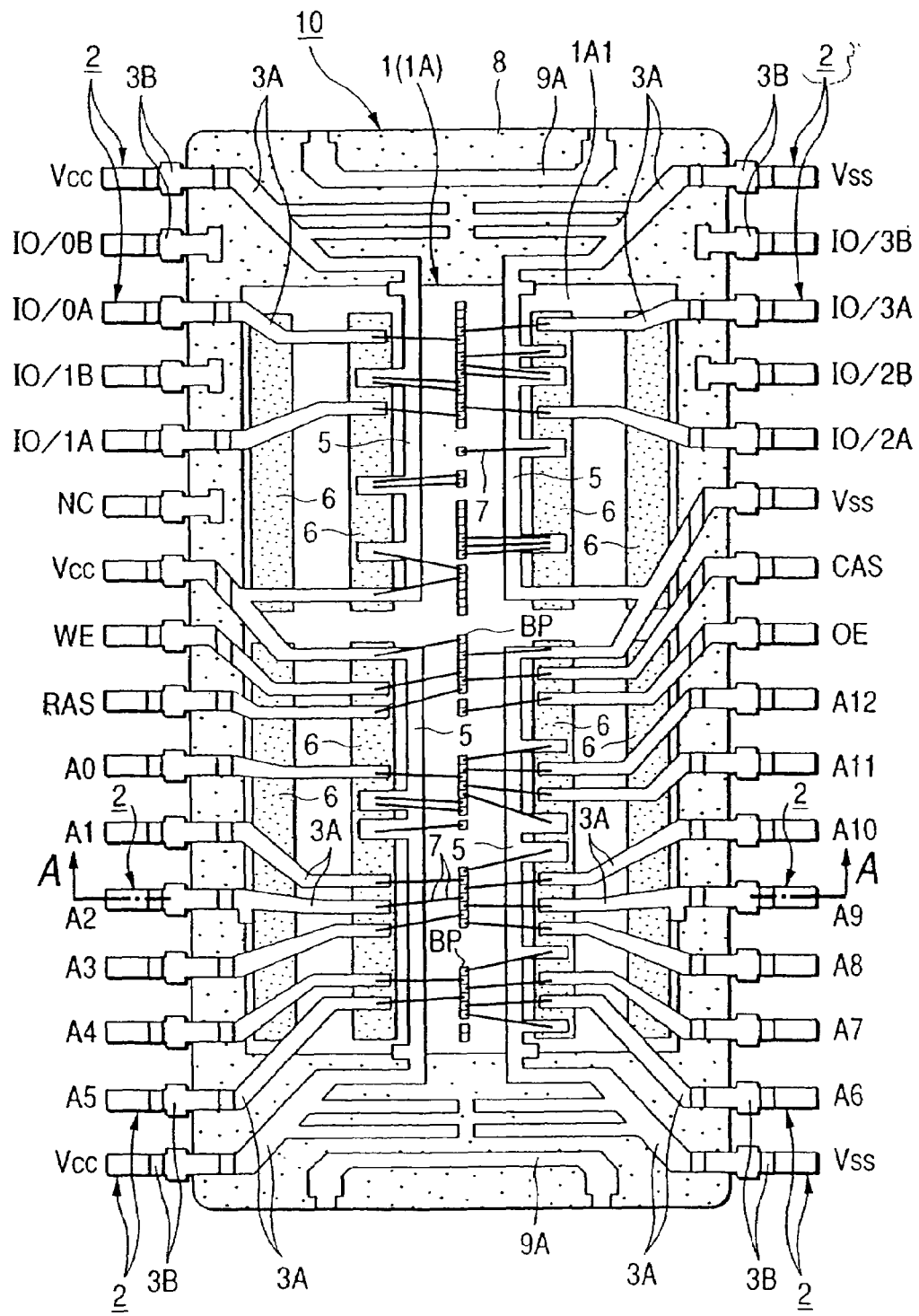
FIG. 1 is a plan view illustrating a state where an upper part is removed from a resin mold of a semiconductor device representing an embodiment 1 of the present invention.

Embodiments of the present invention will now be described in detail with reference to the drawings. In the drawings illustrating the embodiments of the invention, those having the same functions are denoted by the same reference numerals but their description will not be repeated.

Embodiment 1.

In this embodiment, the present invention is applied to a semiconductor device of the TSOP (thin small outline package) type having a bidirectional lead arrangement structure.

Figure 2:
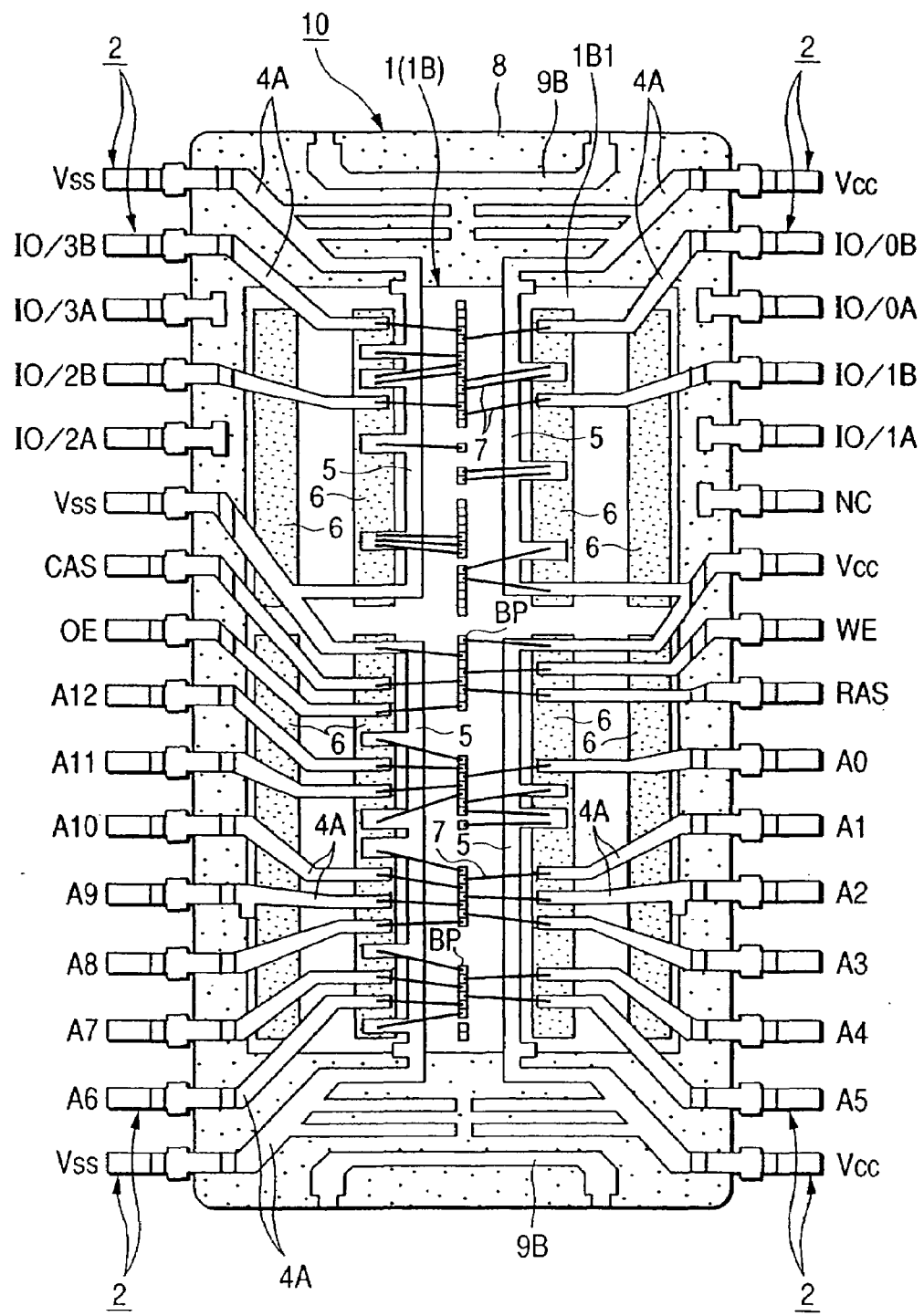
FIG. 2 is a bottom view illustrating a state where a lower part is removed from the resin mold of the semiconductor device.
Figure 3:
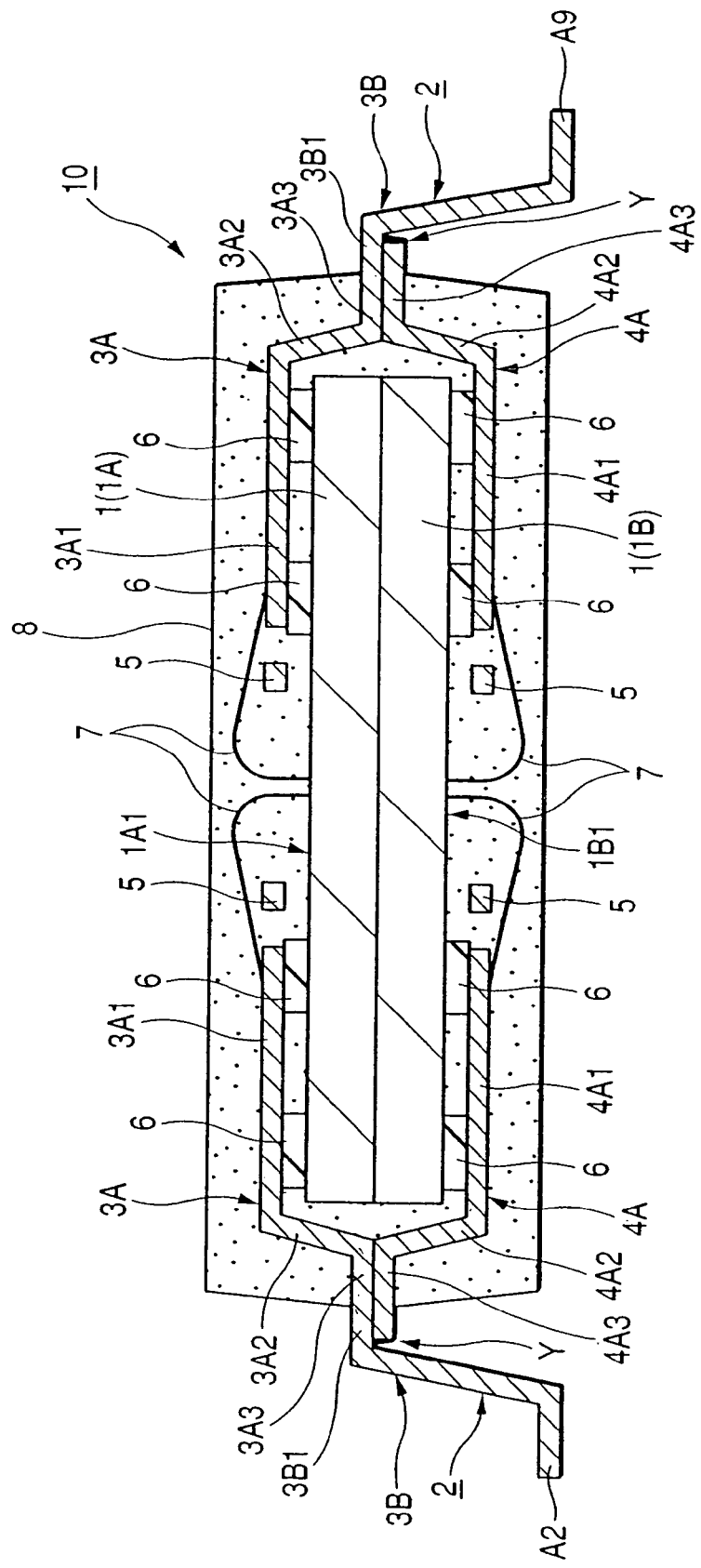
FIG. 3 is a sectional view cut along line A—A in FIG. 1.

FIG. 1 is a plan view illustrating a state where an upper part is removed from a resin mold of a semiconductor device of the present invention, FIG. 2 is a bottom view illustrating a state where a lower part is removed from the resin mold of the semiconductor device, and FIG. 3 is a sectional view cut along line A—A in FIG. 1.

As shown in FIGS. 1, 2 and 3, the semiconductor device 10 of this embodiment has two semiconductor chips 1 stacked one upon the other and the two chips are molded with a resin 8. The two semiconductor chips 1 are stacked one upon the other, with their back surfaces opposed to each other.

The two semiconductor chips 1 have the same external size. The two semiconductor chips 1 have, for example, a rectangular planar shape, though the invention is in no way limited thereto.

The two semiconductor chips 1 are each constituted chiefly by a semiconductor substrate of single crystalline silicon and a multi-layer wiring layer formed on the front surface out of the front and back surfaces thereof. A DRAM (dynamic random access memory) of, for example, 64 megabits is constituted as a memory circuit system in each of the two semiconductor chips 1.

A plurality of external terminals (bonding pads) BP are formed at a central portion of a circuit-forming surface 1A1 which is the front surface of one semiconductor chip 1A out of the two semiconductor chips 1 along the long side of a rectangle thereof (see FIG. 1). The plurality of external terminals BP are formed on the uppermost wiring layer among the multiplicity of wiring layers of the semiconductor chip 1A. The uppermost wiring layer is covered with a surface protective film (final protective film) formed on the upper surface thereof. Bonding openings are formed in the surface protective film to expose the surfaces of the external terminals BP.

A plurality of external terminals BP are formed at a central portion of a circuit-forming surface 1B1 which is the front surface of the other semiconductor chip 1B out of the two semiconductor chips 1 along the long side of a rectangle thereof (see FIG. 2). The plurality of external terminals BP are formed on the uppermost wiring layer among the multiplicity of wiring layers of the semiconductor chip 1B. The uppermost wiring layer is covered with a surface protective film (final protective film) formed on the upper surface thereof. Bonding openings are formed in the surface protective film to expose the surfaces of the external terminals BP.

A circuit pattern of the DRAM constituted in the one semiconductor chip 1A is the same as the circuit pattern of the DRAM constituted in the other semiconductor chip 1B. Furthermore, the arrangement pattern of the external terminals BP formed on the circuit-forming surface 1A1 of the one semiconductor chip 1A is the same as the arrangement pattern of the external terminals BP formed on the circuit-forming surface 1B1 of the other semiconductor chip 1B. That is, the two semiconductor chips 1 have the same structure.

Though there is no particular limitation to shape, the resin mold 8 has, for example, a rectangular planar shape. A plurality of leads 2 are arranged on the outer sides of the two opposing long sides of the resin mold 8 along the long sides thereof. The plurality of leads 2 extend from the inside to the outside of the resin mold 8. The group of leads an the right side shown in FIG. 1 corresponds to the group of leads on the left side shown in FIG. 2, and the group of leads on the left side shown in FIG. 1 corresponds to the group of leads on the right side shown in FIG. 2.

Terminals names are given to the plurality of leads 2. A terminal Vcc is a power source potential terminal fixed to a power source potential (e.g., 5 V). A terminal Vss is a reference potential terminal fixed to a reference potential (e.g., 0 V). An IO/0A terminal, an IO/0B terminal, an IO/1A terminal, an IO/1B terminal, an IO/2A terminal, an IO/2B terminal, an IO/3A terminal and an IO/3B terminal are data input/output terminals. A terminal Q0 to a terminal A12 are address input terminals. A terminal RAS is a row address strobe terminal. A terminal CAS is a column address strobe terminal. A terminal WE is a read/write enable terminal. A terminal OE is an output enable terminal. A terminal NC is a free terminal.

Among the above-mentioned plurality of leads 2, the lead 2 which is the address input terminal, the lead 2 which is the row address strobe terminal, the lead 2 which is the column address strobe terminal, the lead 2 which is the read/write enable terminal, and the lead 2 which is the output enable terminal, are branched in the up-and-down direction (in which the chips are stacked) inside the resin mold 8, and are bent to have two branch leads (3A, 4A). The one branch lead 3A is adhered and secured to the circuit-forming surface 1A1 of the one semiconductor chip 1A via an insulating film 6, and is electrically connected to the external terminal BP of the circuit-forming surface 1A1 via an electrically conductive wire 7. The other branch lead 4A is adhered and secured to the circuit-forming surface 1B1 of the other semiconductor chip 1B via an insulating film 6, and is electrically connected to the external terminal BP of the circuit-forming surface 1B1 via an electrically conductive wire 7.

That is, the lead 2 which is the address input terminal, the lead 2 which is the row address strobe terminal, the lead 2 which is the column address strobe terminal, the lead 2 which is the read/write enable terminal, and the lead 2 which is the output enable terminal, are electrically connected to the respective external terminals BP of the two semiconductor chips 1.

Among the plurality of leads 2, the lead 2 which is the power source potential terminal and the lead 2 which is the reference potential terminal are branched in the up-and-down direction (in which the chips are stacked) in the resin mold 8, and are bent to have two branch leads (3A, 4A).

The one branch lead 3A extends on the circuit-forming surface 1A1 of the semiconductor chip 1A in a direction in which the external terminals BP are arranged, and is integrated with a bus bar lead 5 disposed between the end of the other branch lead 3A and the external terminal BP. The bus bar lead 5 is integrated with a fixed lead adhered and secured to the circuit-forming surface 1A1 of the semiconductor chip 1A via an insulating film 6, and the fixed lead is electrically connected to the external terminal BP of the semiconductor chip 1A via a wire 7.

The other branch lead 4A extends on the circuit-forming surface 1B1 of the semiconductor chip 1B in a direction in which the external terminals BP are arranged, and is integrated with a bus bar lead 5 arranged between the end of the other branch lead 4A and the external terminal BP. The bus bar lead 5 is integrated with a fixed lead adhered and secured to the circuit-forming surface 1B1 of the semiconductor chip 1B via an insulating film 6, and the fixed lead is electrically connected to the external terminal BP of the semiconductor chip 1B via a wire 7.

That is, the lead 2 which is the power source potential terminal and the lead 2 which is the reference potential terminal are electrically connected to the external terminals BP of the two semiconductor chips 1, respectively.

Furthermore, the semiconductor device 10 of this embodiment is constituted to have an LOC (lead on chip) structure in which the branch lead 3A and the bus bar lead 5 are arranged on the circuit-forming surface 1A1 of the semiconductor chip 1A, and the branch lead 4A and the bus bar lead 5 are arranged on the circuit-forming surface 1B1 of the semiconductor chip 1B.

Among the leads 2 which are the data input/output terminals, the leads 2 which are the terminals IO/0A, IO/1A, IO/2A and IO/3A are bent to have branch leads 3A in the resin mold 8. The branch leads 3A are adhered and secured to the circuit-forming surface 1A1 of the semiconductor chip 1A via an insulating film 6, and are electrically connected to the external terminals BP of the circuit-forming surface 1A1 via wires 7. That is, the leads 2 which are the terminals IO/0A, IO/1A, IO/2A and IO/3A are not electrically connected to the external terminals BP of the semiconductor chip 1B.

Among the leads 2 which are the data input/output terminals, the leads 2 which are the terminals IO/0B, IO/1B, IO/2B and IO/3B are bent to have branch leads 4A in the resin mold 8. The branch leads 4A are adhered and secured to the circuit-forming surface 1B1 of the semiconductor chip 1B via an insulating film 6, and are electrically connected to the external terminals BP of the circuit-forming surface 1B1 via wires 7. That is, the leads 2 which are the terminals IO/0B, IO/1B, IO/2B and IO/3B are not electrically connected to the external terminals BP of the semiconductor chip 1A.

Referring to FIG. 3, the one branch lead 3A is constituted by a first portion 3A1 which traverses the one side of the circuit-forming surface 1A1 of the one semiconductor chip 1A and extends on the circuit-forming surface 1A1 of the one semiconductor chip 1A, a second portion 3A2 bent from the first portion 3A1 toward the back surface side of the one semiconductor chip 1A, and a third portion 3A3 bent from the second portion 3A2 toward the outer side of the one semiconductor chip 1A. The first portion 3A1 is adhered and secured to the circuit-forming surface 1A1 of the semiconductor chip 1A via the insulating film 6. The end of the first portion 3A1 is disposed near the external terminal BP formed at the central portion of the circuit-forming surface 1A1 of the semiconductor chip 1A. A wire 7 is connected to the end of the first portion 3A1.

The other branch lead 4A is constituted by a first portion 4A1 which traverses the one side of the circuit-forming surface 1B1 of the other semiconductor chip 1B and extends on the circuit-forming surface 1B1 of the other semiconductor chip 1B, a second portion 4A2 bent from the first portion 4A1 toward the back surface side of the other semiconductor chip 1B, and a third portion 4A3 so bent from the second portion 4A2 as to be overlapped with the third portion 3A3 of the one branch lead 3A. The first portion 4A1 is adhered and secured to the circuit-forming surface 1B1 of the semiconductor chip 1B via the insulating film 6. The end of the first portion 4A1 is disposed near the external terminal BP formed at the central portion of the circuit-forming surface 1B1 of the semiconductor chip 1B. A wire 7 is connected to the end of the first portion 4A1.

The third portion 3A1 of the branch lead 3A is integrated with an external lead 3B led to the outside from the resin mold 8. The external lead 3B is formed in a surface-mount shape, e.g., in a gull-wing shape. The third portion 4A3 of the branch lead 4A is joined at its end Y to the root portion 3B1 of the external lead 3B, and is electrically and mechanically connected thereto. That is, the two branch leads (3A, 4A) are constituted by separate members.

Though there is no particular limitation, the end of the third portion 4A3 of the branch lead 4A is joined to the root portion 3B1 of the external lead 3B by, for example, seam welding by using a laser beam in order to increase the strength of the junction. In this embodiment, the seam welding is effected after the resin mold 8 has been formed.

The external lead 3B is so bent that a lead portion continuous with the root portion 3B1 is positioned on the other branch lead 4A side.

As the insulating film 6, use is made of, for example an insulating film obtained by forming an adhesive layer of a polyimide resin on both surfaces (front surface and back surface) of the resin substrate of polyimide resin. As the electrically conductive wire 7, use is made, for example, of a gold (Au) wire. Furthermore, the wire 7 is bonded by, for example, thermocompression bonding using ultrasonic vibration.

Support leads 9A are arranged in the resin mold 8 on the outer sides of the two opposing short sides of the semiconductor chip 1A. Support leads 9B are arranged in the resin mold 8 on the outer sides of the two opposing short sides of the semiconductor chip 1B. The support leads 9A and 9B are for supporting the resin mold 8 by the lead frame in the process for producing the semiconductor device 10.

In order to reduce the stress, the resin mold 8 is formed of, for example, biphenyl resin to which are added a phenol curing agent, silicone rubber and a filler. The resin mold 8 is formed by a transfer-molding method which is suited for mass production. The transfer-molding method uses a metal mold equipped with a pot, a runner, a flow gate and a cavity, and forms the resin mold by injecting, with pressure, the resin into the cavity from the pot through the runner and the flow gate.

In the semiconductor device 10, the one branch lead 3A is adhered and secured to the circuit-forming surface 1A1 of the one semiconductor chip 1A through the insulating film 6, and the other branch lead 4A is adhered and secured to the circuit-forming surface 1B1 of the other semiconductor chip 1B through the insulating film 6. Furthermore, the one semiconductor chip 1A and the other semiconductor chip 1B are stacked one upon the other in a state where their back surfaces are opposed to each other. Therefore, the branch leads (3A, 4A) do not exist between the two semiconductor chips 1, making it possible to decrease the gap between the two semiconductor chips 1 and, hence, to decrease the thickness of the resin mold 8 correspondingly.

Since the two branch leads (3A, 4A) do not exist between the two semiconductor chips 1, the stray capacitance produced relative to the other semiconductor chip 1B can be substantially precluded from the stray capacitance (chip-lead capacitance) added to the one branch lead 3A, and the stray capacitance produced relative to the one semiconductor chip 1A can be substantially precluded from the stray capacitance (chip-lead capacitance) added to the other branch lead 4A. Accordingly, the stray capacitance can be reduced which is added to the lead 2 which is branched in the resin mold 8, the one branch lead 3A adhered and secured to the circuit-forming surface 1A1 of the one semiconductor chip 1A through the insulating film 6, and the other branch lead 4A adhered and secured to the circuit-forming surface 1B1 of the other semiconductor chip 1B through the insulating film 6.

Moreover, the one semiconductor chip 1A and the other semiconductor chip 1B are stacked one upon the other in a state where their back surfaces are in contact with each other. Therefore, there exists no gap between the two semiconductor chips 1, and the thickness of the resin mold 8 can be further decreased correspondingly.

Next, the constitution of the lead frame used in the process for producing the semiconductor device 10 will be described.

Figure 4:
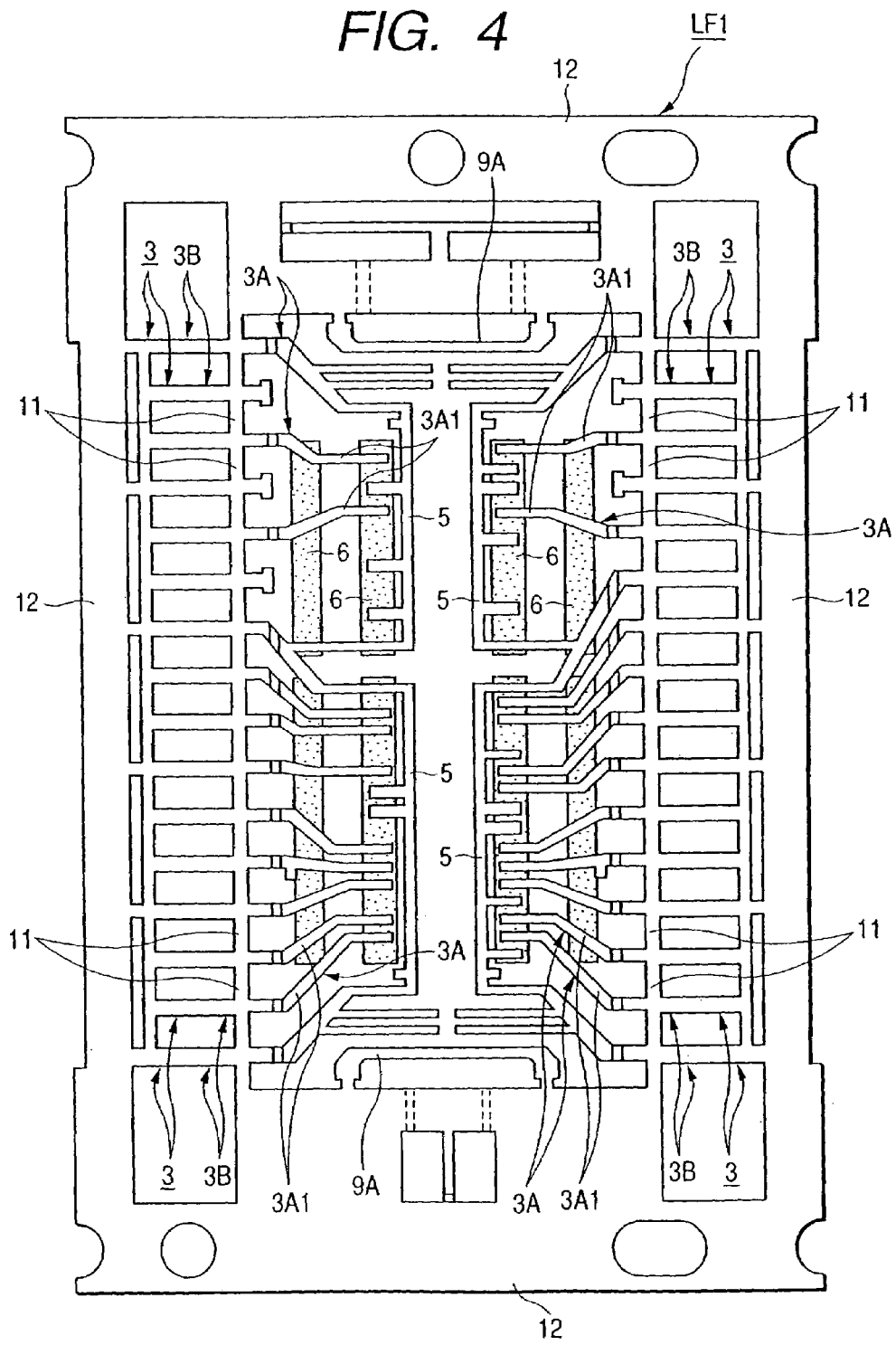
FIG. 4 is a plan view of a lead frame used in a process for producing the semiconductor device.

The semiconductor device 10 is produced by using a lead frame LF1 shown in FIG. 4 (plan view) and a lead frame LF2 shown in FIG. 5 (plan view).

Referring to FIG. 4, the lead frame LF1 includes a plurality of leads 3, four bus bar leads 5 and two support leads 9A arranged in a region defined by a frame 12. The plurality of leads 3 are divided into two groups of leads. The leads 3 of one group are arranged in the direction of extension of the frame 12 which is opposed to one long side of the semiconductor chip (1A), and are integrated with the frame 12. The leads 3 of the other group are arranged in the direction of extension of the frame 12 which is opposed to the other long side of the semiconductor chip (1A), and are integrated with the frame 12. The four bus bar leads 5 extend in the direction of the long side of the semiconductor chip (1A), and are integrated with the leads 3 arranged at the first stage, middle stage and last stage of the lead arrangement. The two support leads 9A are integrated with the frame 12 opposed to the short sides of the semiconductor chip (1A).

The plurality of leads 3 are constituted by the internal leads molded with the resin 8 and the external leads 3B led to the outside of the resin mold (8), and are connected together through tie bars 11. Among the plurality of leads 3, most of the leads 3 are constituted as branch leads 3A. Each branch lead 3A is constituted in the same manner as the one shown in FIG. 3, i.e., constituted by a first portion 3A1, a second portion 3A2 and a third portion 3A3. The branch lead 3A is so bent that a first portion 3A1 traverses the circuit-forming surface 1A1 of the semiconductor chip 1A and is positioned on the circuit-forming surface 1A1 of the semiconductor chip 1A, and the back surface of the third portion 3A3 is so positioned as to be flush with the back surface of the semiconductor chip 1A.

The lead frame LF1 is formed by subjecting a flat plate of, for example, an iron (Fe)-nickel (Ni) alloy or copper (Cu) or a copper alloy to etching or to press forming to thereby form a predetermined lead pattern and, then, subjecting the internal lead portions of the leads 3 to the press forming.

The insulating film 6 is stuck to the back surface of the first portion 3A1 of the branch lead 3A. Furthermore, the bus bar leads 5 are integrated with the fixed lead secured to the circuit-forming surface of the semiconductor chip 1A, and the insulating film 6 is stuck to the back surface of the fixed lead.

Referring to FIG. 5, the lead frame LF2 includes a plurality of leads 4, four bus bar leads 5 and two support leads 9B arranged in a region defined by a frame 12. The plurality of leads 4 are divided into two groups of leads. The leads 4 of one group are arranged in the direction of extension of the frame 12 which is opposed to one long side of the semiconductor chip (1B). The leads 4 of the other group are arranged in the direction of extension of the frame 12 which is opposed to the other long side of the semiconductor chip (1B). The four bus bar leads 5 extend in the direction of the long side of the semiconductor chip (1B), and are integrated with the leads 4 arranged at the first stage, middle stage and last stage of the lead arrangement. The two support leads 9B are integrated with the frame 12 opposed to the short sides of the semiconductor chip (1B).

The plurality of leads 4 are constituted by the internal leads molded with the resin 8 and the external leads led to the outer side of the resin mold 8, and are connected together through tie bars 11. The plurality of leads 4 are integrated with the frame 12 through the tie bars 11.

The external leads of the plurality of leads 4 are formed in a shape having no front end portions beyond the tie bars 11, and are shorter than the external leads 3B of the above-mentioned leads 3. Among the plurality of leads 4, most of leads 4 are constituted as branch leads 4A. Each branch lead 4A is constituted in the same manner as the one shown in FIG. 3, i.e., constituted by a first portion 4A1, a second portion 4A2 and a third portion 4A3. The branch lead 4A is so bent that the first portion 4A1 traverses the circuit-forming surface 1B1 of the semiconductor chip 1B and is positioned on the circuit-forming surface 1B1 of the semiconductor chip 1B, and the back surface of the third portion 3B3 is so positioned as to be flush with the back surface of the semiconductor chip 1B.

The lead frame LF2 is formed by subjecting a flat plate of, for example, an iron (Fe)-nickel (Ni) alloy or copper (Cu) or a copper alloy, to etching or to press forming to thereby form a predetermined lead pattern and, then, subjecting the internal lead portions of the leads 4 to press forming.

The insulating film 6 is stuck to the back surface of the first portion 4A1 of the branch lead 4A. Furthermore, the bus bar leads 5 are integrated with the fixed lead secured to the circuit-forming surface of the semiconductor chip 1B, and the insulating film 6 is stuck to the back surface of the fixed lead.

After the external terminals of the semiconductor chip and the leads are electrically connected together through electrically conductive wires, the lead frames LF1 and LF2 are used in a state where the back surfaces are mated with each other, as will be described later in detail. Therefore, the leads 3 on the left side in FIG. 4 are so arranged that the portions (superposed portions) near the tie bars are superposed on the portions (superposed portions) near the tie bars of the leads 4 of the right side in FIG. 5, and the leads 3 on the right side of FIG. 4 are so arranged that the portions (superposed portions) near the tie bars are superposed on the portions near the tie bars of the leads 4 of the left side in FIG. 5.

Next, the method of producing the semiconductor device 10 will be described with reference to FIGS. 6(A) and 6(B) (sectional views) FIG. 7 (sectional view of an essential portion) and FIG. 8 (perspective view of an essential portion).

First, the two semiconductor chips (1A, 1B) 1 of the same structure are prepared, and the lead frame LF1 shown in FIG. 4 and the lead frame LF2 shown in FIG. 5 are prepared.

Next, one semiconductor chip 1A is secured to the lead frame LF1 and the other semiconductor chip 1B is secured to the lead frame LF2. The semiconductor chip 1A is secured to the lead frame LF1 by adhering and securing the first portions 3A1 of the branch leads 3A which are the internal leads of the leads 3 and the fixed leads integral with the bus bar leads 5 to the circuit-forming surface 1A1 which is the front surface out of the front surface and the back surface of the semiconductor chip 1A, via the insulating film 6. The semiconductor chip 1B is secured to the lead frame LF2 by adhering and securing the first portions 4A1 of the branch leads 4A which are the internal leads of the leads 4 and the fixed leads integral with the bus bar leads 5 to the circuit-forming surface 1B1 which is the front surface out of the front surface and the back surface of the semiconductor chip 1B, via the insulating film 6.

In this step, the semiconductor chip 1A is secured to the lead frame LF1 by adhering and securing the first portions 3A1 of the branch leads 3A and the fixed leads of the bus bar leads 5 to the circuit-forming surface 1A1 of the semiconductor chip 1A. Therefore, the semiconductor chip 1A is stably held by the lead frame LF1. Moreover, the semiconductor chip 1B is secured to the lead frame LF2 by adhering and securing the first portions 4A1 of the branch leads 4A and the fixed leads of the bus bar leads 5 to the circuit-forming surface 1B1 of the semiconductor chip 1B. Therefore, the semiconductor chip 1B is stably held by the lead frame LF2.

Next, in the lead frame LF1, the external terminals BP of the semiconductor chip 1A are electrically connected to the ends of the first portions 3A1 of the branch leads 3A and to the fixed leads of the bus bar leads 5 through the electrically conductive wires 7. In the lead frame LF2, the external terminals BP of the semiconductor chip 1B are electrically connected to the ends of the first portions 4A1 of the branch leads 4A and to the fixed leads of the bus bar leads 5 through the electrically conductive wires 7. As the wires 7, use is made of, for example, gold (Au) wires. The wires are bonded by, for example, thermocompression bonding using ultrasonic vibration.

In this step, the leads 3 of the lead frame LF1 are so bent that the first portions 3A1 which are the branch leads 3A of the internal leads are positioned on the circuit-forming surface 1A1 of the semiconductor chip 1A and that the back surfaces of the third portions 3A3 which are the branch leads 3A of the internal leads are flush with the back surface of the semiconductor chip 1A. As shown in FIG. 6(A), therefore, the back surface of the semiconductor chip 1A and the back surfaces of the third portions 3A3 of the branch leads 3A can be brought into direct contact with a heat stage HS. Accordingly, the heat of the heat stage HS is effectively conducted to the semiconductor chip 1A and to the branch leads 3A, enabling the external terminals BP of the semiconductor chip 1A to be reliably connected to the leads 3 of the lead frame LF1 through the wires 7.

In this step, furthermore, the leads 4 of the lead frame LF2 are so bent that the first portions 4A1 which are the branch leads 4A of the internal leads are positioned on the circuit-forming surface 1B1 of the semiconductor chip 1B and that the back surfaces of the third portions 4A3 which are the branch leads 4A of the internal leads are flush with the back surface of the semiconductor chip 1B. As shown in FIG. 6(B), therefore, the back surface of the semiconductor chip 1B and the back surfaces of the third portions 3B3 of the branch leads 3B can be brought into direct contact with the heat stage HS. Accordingly, the heat of the heat stage HS is effectively conducted to the semiconductor chip 1B and to the branch leads 3B, enabling the external terminals BP of the semiconductor chip 1B to be reliably connected to the leads 4 of the lead frame LF2 through the wires 7.

In this step, furthermore, the ends of the first portions 3A1 of the branch leads 3A are arranged near the external terminals BP formed at the central portion of the circuit-forming surface 1A1 of the semiconductor chip 1A. Therefore, the length of the wires 7 can be shortened compared with the case in which the ends of the leads arranged on the outer side of the semiconductor chip are connected to the external terminals formed at the central portion of the circuit-forming surface of the semiconductor chip through the wires.

In this step, furthermore, the ends of the first portions 4A1 of the branch leads 4A are arranged near the external terminals BP formed at the central portion of the circuit-forming surface 1B1 of the semiconductor chip 1B. Therefore, the length of the wires 7 can be shortened compared with the case in which the ends of the leads arranged on the outer side of the semiconductor chip are connected to the external terminals formed at the central portion of the circuit-forming surface of the semiconductor chip through the wires.

The external terminals BP of the semiconductor chip 1A are connected to the branch leads 3A through the wires 7 jumping over the bus bar leads 5.

Furthermore, the external terminals BP of the semiconductor chip 1B are connected to the branch leads 4A through the wires 7 jumping over the bus bar leads 5.

The external terminals BP of the semiconductor chip 1A are connected to the branch leads 3A through the wires 7 by reverse bonding in such a way that the wires 7 are laterally reversed with respect to the connection of the external terminals BP of the semiconductor chip 1B to the branch leads 4A.

Next, the back surfaces of the lead frames LF1 and LF2 are mated with each other so that the back surfaces of the one semiconductor chip 1A and of the other semiconductor chip 1B are mated with each other. In this embodiment, the back surfaces of the one semiconductor chip 1A and of the other semiconductor chip 1B are brought into contact with each other. The back surfaces of the semiconductor chip 1A and of the semiconductor chip 1B are kept in contact with each other due to the resilient forces of the branch leads 3A (leads 3) and of the branch leads 4A (leads 4). In this embodiment, furthermore, the external leads of the leads 4 are shorter than the external leads 3B of the leads 3. Therefore, the back surfaces (abutting surfaces) of the external leads 3B are exposed beyond the ends Y of the third portions 4A3 of the branch leads 4A.

Figure 7:
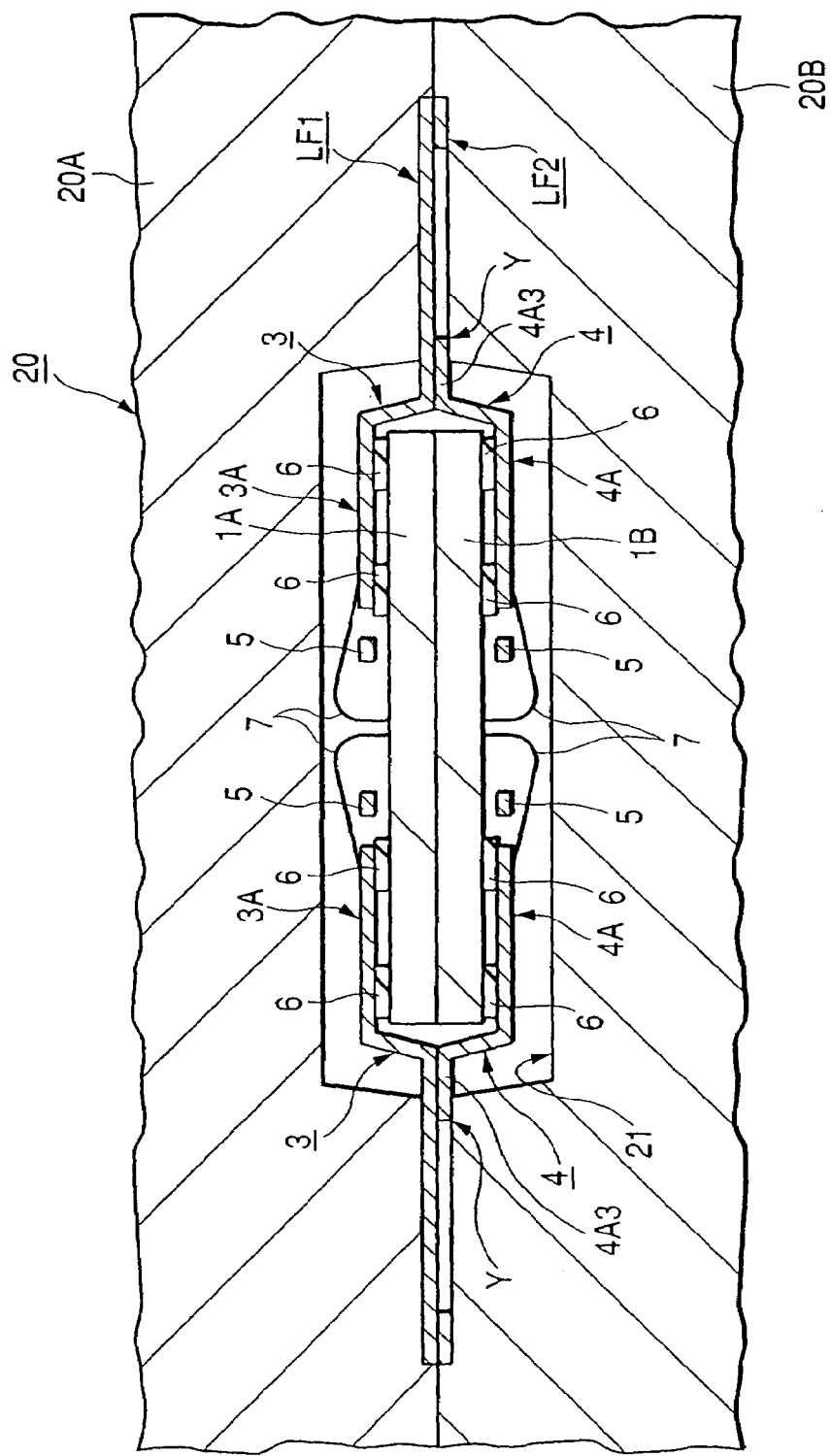
FIG. 7 is a sectional view illustrating the method of producing the semiconductor device.

Referring next to FIG. 7, the lead frames LF1 and LF2 are disposed between a top force 20A and a bottom force 20B of a mold 20 in a state where the lead frames LF1 and LF2 are superposed one upon the other. The semiconductor chip 1A, semiconductor chip 1B, branch leads 3A, branch leads 4A, support leads 9A, 9B, and wires 7 are arranged in a cavity 21 formed by the top force 20A and the bottom force 20B of the mold 20. In this step, the ends Y of the third portions 4A3 of the branch leads 4A are positioned on the outer side of the cavity 21.

Next, a resin is injected under pressure into the cavity 21 from the pot of the mold 20 through the runner and the flow gate to thereby form the resin mold 8. In this step, the length of the wires 7 has been shortened compared to the case where the ends of the leads arranged on the outer side of the semiconductor chip are connected to the external terminals formed at the central portion on the circuit-forming surface of the semiconductor chip through the wires. Therefore, the deformation of wires can be suppressed though the resin is injected under pressure. Moreover, the semiconductor chip 1A is stably held by the lead frame LF1, and the semiconductor chip 1B is stably held by the lead frame LF2. Therefore, the positions of the two semiconductor chips 1 are prevented from being deviated though the resin is injected into the cavity 21 under pressure.

In this step, furthermore, the two lead frames (LF1, LF2) are held by the resin mold 8 in a state where their back surfaces are mated with each other.

Figure 8:
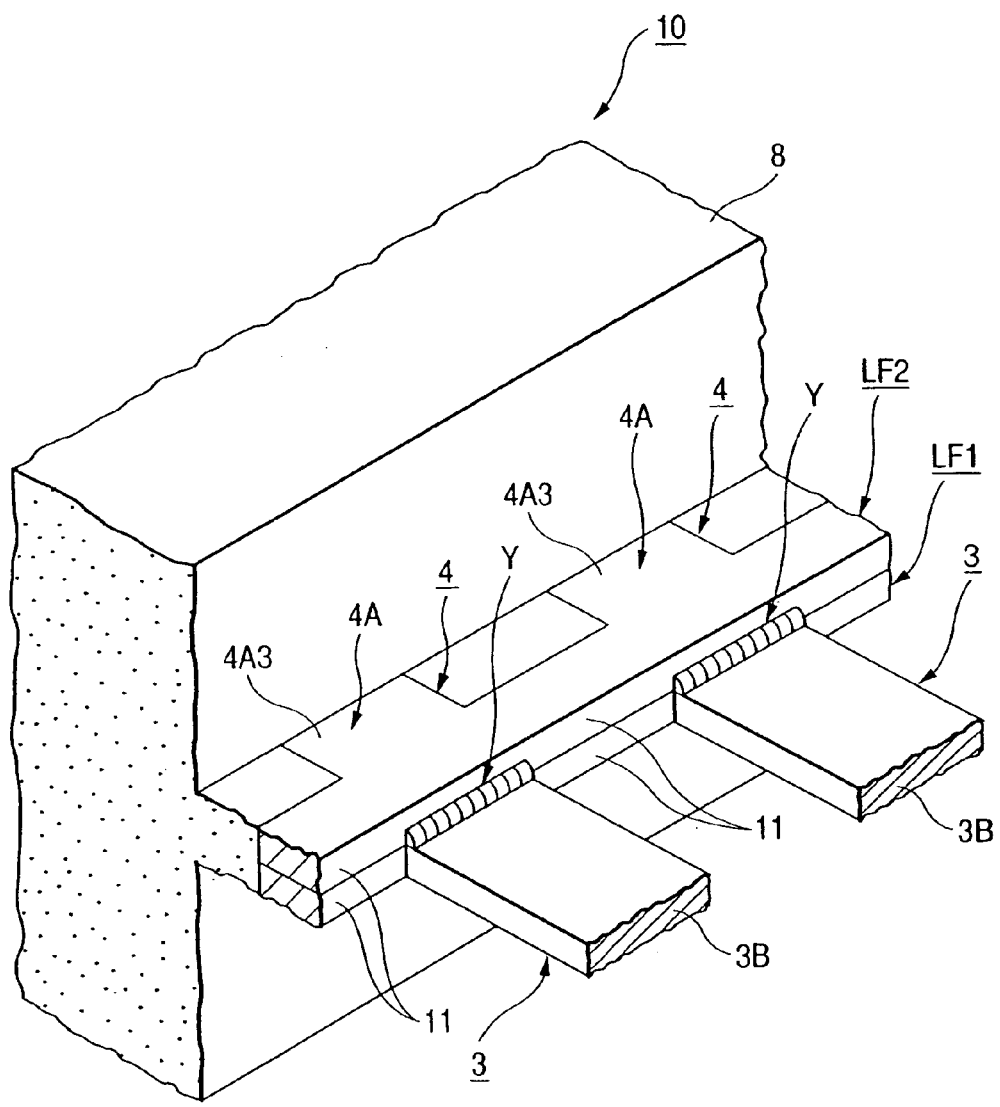
FIG. 8 is a perspective view illustrating the method of producing the semiconductor device.

Then, the lead frames LF1, LF2 are taken out from the mold 20, and, as shown in FIG. 8, the ends Y of the third portions 4A3 of the branch leads 4A and the root portions of the external leads 3B exposed therefrom are joined together. The junction is effected by, for example, seam welding using a laser beam.

Next, the tie bars 11 connected to the leads 4 and the tie bars 11 connected to the leads 3 are cut. At this moment, the leads 4, i.e., the branch leads 4A are separated from the frame 12 of the lead frame LF2.

Next, plating is effected and, then, the leads 3 are cut from the frame 12 of the lead frame LF1. Thereafter, the external leads 3B of the leads 3 are formed in a surface-mount shape, e.g., formed in a gull-wing shape. The external leads 3B are so bent that the lead portions continuous with the root portions (3B1) thereof are positioned on the branch leads 4A side.

Next, the support leads 9A are cut from the frame 12 of the lead frame LF1, and the support leads 9B are cut from the frame 12 of the lead frame LF2. Then, the leads 2 are formed, having two branch leads (3A, 4A) branched in the up-and-down direction in the resin mold 8 and extending from the inside to the outside of the resin mold 8. There is further formed the semiconductor device 10 shown in FIGS. 1, 2 and 3.

Figure 9:
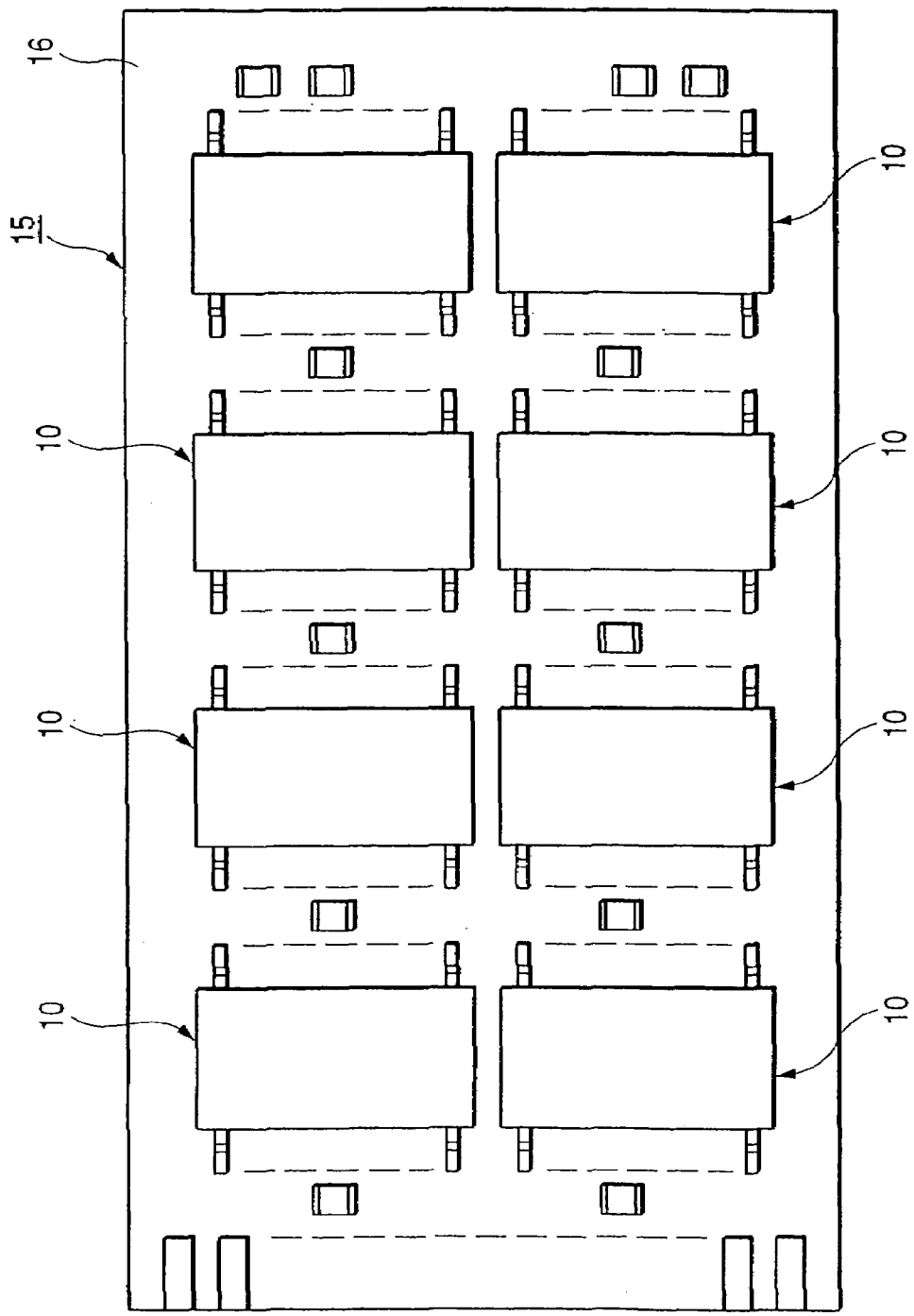
FIG. 9 is a plan view of an electronic apparatus mounted with the semiconductor device.

A plurality of thus constituted semiconductor devices 10 are mounted on a mounting substrate 16 as components of an electronic apparatus 15 constituting a circuit system as shown in FIG. 9 (plan view).

With this embodiment as described above, there are obtained the following effects.

(1) The two semiconductor chips 1 are stacked one upon the other in a state where the back surfaces thereof are opposed to each other, and the branch leads (3A, 3B) do not exist between the two semiconductor chips 1. Therefore, the gap between the two semiconductor chips 1 can be decreased, and the thickness of the resin mold 8 can be decreased correspondingly. It is therefore possible to decrease the thickness of the semiconductor device 10.

Moreover, the two branch leads (3A, 4A) do not exist between the two semiconductor chips 1. Therefore, the stray capacitance produced relative to the other semiconductor chip 1B is substantially excluded from the stray capacitance (chip-lead capacitance) added to the one branch lead 3A, and the stray capacitance produced relative to the one semiconductor chip 1A is substantially precluded from the stray capacitance (chip-lead capacitance) added to the other branch lead 4A. Therefore, the stray capacitance added to the lead branched in the resin mold 8, the one branch lead 3A adhered and secured to the surface of the one semiconductor chip 1A through the insulating film 6 and the other branch lead 3B adhered and secured to the surface of the other semiconductor chip 1B via the insulating film 6 can be reduced. Accordingly, the signal propagation speed of the lead 2 increases, and the semiconductor device 10 exhibits improved electric characteristics. In the case of the semiconductor chip 1 in which the external terminals BP are arranged at the central portion on the surface thereof, the branch leads or the ends of the leads 2 must be extended near to the central portion of the semiconductor chip 1, resulting in an increase in the area where the leads 2 are opposed to the surface of the semiconductor chip 1. In the semiconductor device 10 employing the LOC structure, therefore, it is important to stack the two semiconductor chips 1 one upon the other in a state where the back surfaces of the two semiconductor chips 1 are opposed to each other.

(2) Since the one semiconductor chip 1A and the other semiconductor chip 1B are stacked one upon the other in a state where the back surfaces thereof are in contact with each other, there exists no gap between the two semiconductor chips 1, and the thickness of the resin mold 8 can be further decreased correspondingly. As a result, the thickness of the semiconductor device 10 can be further decreased.

(3) The lead 2 has two branch leads (3A, 4A) branched in the up-and-down direction in the resin mold 8, the one branch lead 3A being constituted by a first portion 3A1 which extends on the circuit-forming surface 1A1 of the one semiconductor chip 1A traversing the one side thereof and to which the wire 7 is connected, a second portion 3A2 bent from the first portion 3A1 toward the back surface of the one semiconductor chip 1A, and a third portion 3A3 bent from the second portion 3A2 toward the outside of the one semiconductor chip 1A, and the other branch lead 4A being constituted by a first portion 3B1 which extends on the circuit-forming surface 1B1 of the other semiconductor chip 1B traversing the one side thereof and to which the wire 7 is connected, a second portion 3B2 bent from the first portion 3B1 toward the back surface of the other semiconductor chip 1B, and a third portion 3B3 so bent from the second portion 3B2 as to be superposed on the third portion 3A3 of the one branch lead 3A. The third portion 3A3 of the one branch lead 3A is integrated with the external lead 3B led to the outside from the resin mold 8, and the third portion 4A3 of the other branch lead 4A is joined at its end Y to the root portion 3B1 of the external lead 3B. It is therefore possible to electrically connect the leads 2 to the external terminals BP of the two semiconductor chips 1 that are so stacked one upon the other that the back surfaces thereof are opposed to each other.

(4) The external lead 3B has a lead portion continuous with the root portion 3B1 and bent toward the other branch lead 4A, making it possible to suppress the deterioration of the junction portion where the end Y of the third portion 4A3 of the branch lead 4A is joined to the root portion 3B1 of the external lead 3B.

(5) The end of the first portion 3A1 of the one branch lead 3A is disposed near the external terminal BP formed at the central portion of the circuit-forming surface 1A1 of the one semiconductor chip 1A, and the end of the first portion 4A1 of the other branch lead 4A is disposed near the external terminal BP formed at the central portion of the circuit-forming surface 1B1 of the other semiconductor chip 1B. Therefore, the length of the wires 7 can be shortened compared with that of when the ends of the leads arranged on the outer side of the of the semiconductor chip are connected through wires to the external terminals formed at the central portion of the circuit-forming surface of the semiconductor chip. At the time of forming the resin mold 8 by injecting the resin under pressure into the cavity 21 of the mold 20, therefore, the wires are prevented from being deformed though the resin is injected under pressure. This prevents the mutually adjacent wires 7 from being short-circuited, and the semiconductor devices 10 can be produced with a high yield.

(6) In the process for producing the semiconductor device 10, the semiconductor chip 1A is secured to the lead frame LF1 by adhering and securing the first portion 3A1 of the branch lead 3A and the fixed lead of the bus bar lead 5 to the circuit-forming surface 1A1 of the semiconductor chip 1A. Therefore, the semiconductor chip 1A is stably held by the lead frame LF1. Furthermore, the semiconductor chip 1B is secured to the lead frame LF2 by adhering and securing the first portion 4A1 of the branch lead 4A and the fixed lead of the bus bar lead 5 to the circuit-forming surface 1B1 of the semiconductor chip 1B. Therefore, the semiconductor chip 1B is stably held by the lead frame LF2. As a result, the position of the semiconductor chip is prevented from being deviated in the step of bonding and the semiconductor chips are prevented from coming off while the lead frames are being conveyed, making it possible to produce the semiconductor devices 10 with a high yield.

(7) Upon mounting the semiconductor device 10 on the mounting substrate 16 of the electronic apparatus 15, the memory capacity of the electronic apparatus 15 can be doubled without increasing the area of the mounting substrate 16.

Figure 10:
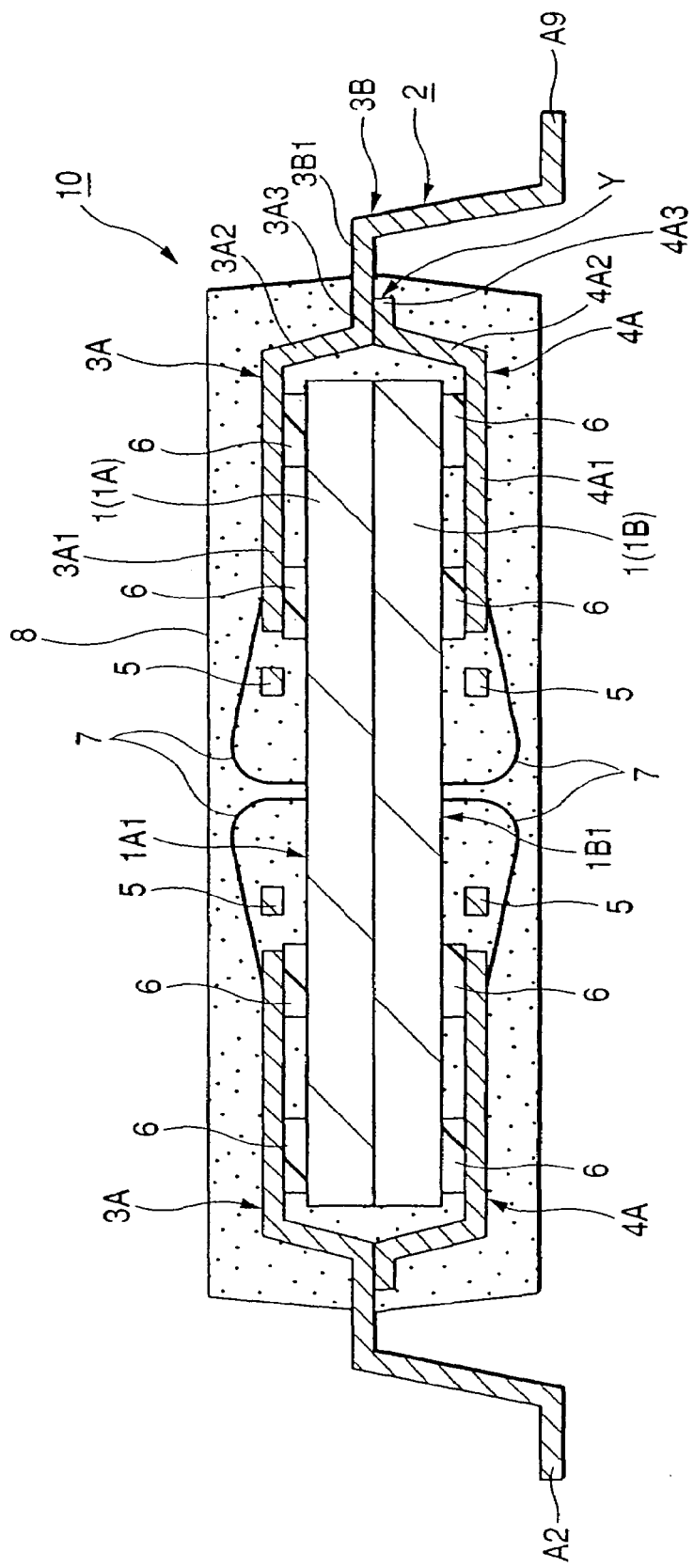
FIG. 10 is a sectional view of a semiconductor device representing an emobdiment which is a modification of the embodiment 1 of the present invention.

Though the above-mentioned embodiment dealt with an example where the end Y of the third portion 4A3 of the branch lead 4A is joined to the root portion 3B1 of the external lead 3B, it is also possible, as shown in FIG. 10 (sectional view) to join the end Y of the third portion 4A3 of the branch lead 4A to the third portion 3A3 of the branch lead 3A in the resin mold 8. In this case, after the step of bonding the wires, the third portion 3A3 of the branch lead 3A and the third portion 4A3 of the branch lead 4A are superposed one upon the other, a portion of the side of the tie bar is so cut that the third portion 4A3 of the branch lead 4A becomes shorter than the third portion 3A3 of the branch lead 3A and, then, the end of the third portion 4A3 of the branch lead 4A is joined to the third portion 3A3 of the branch lead 3A before the step of forming the resin mold 8. As described above, the end of the third portion 4A3 of the branch lead 4A is joined to the third portion 3A3 of the branch lead 3A in the resin mold 8. That is, the end Y of the third portion 4A3 of the branch lead 4A exists in the resin mold, making it possible to decrease the interface region between the resin mold 8 and the lead 2 led from the resin mold 8 and, hence, to decrease the area of the moisture path. Accordingly, the semiconductor device 20 exhibits increased resistance against the humidity.

This embodiment dealt with is an example where the branch lead 3A and the branch lead 4A are adhered and secured to the surfaces of the semiconductor chip 1A and of the semiconductor chip 1B through the insulating films 6. However, the branch lead 3A and the branch lead 4A may be adhered and secured by using an insulating adhesive agent. In this case, the gaps are decreased between the surface of the semiconductor chip 1A and the branch lead 3A and between the surface of the semiconductor chip 1B and the branch lead 4A. Accordingly, the thickness of the resin mold 8 is decreased correspondingly, and the thickness of the semiconductor device 10 is further decreased.

The embodiment dealt with is an example where the external lead 3B of the lead frame LF1 and the branch lead 4A of the lead frame LF2 are joined together after the resin mold 8 was formed. The junction, however, may be formed after the step of bonding the wires. In this case, the lead frames can be easily conveyed after the step of bonding the wires.

Furthermore, the embodiment dealt with is an example where the back surfaces of the two semiconductor chips 1 are in contact with each other However, the back surfaces of the two semiconductor chips 1 may be adhered and secured together with an adhesive agent. In this case, since the two semiconductor chips 1 are secured to each other, the lead frames can be easily conveyed in the process of production.

Embodiment 2.

Figure 11:
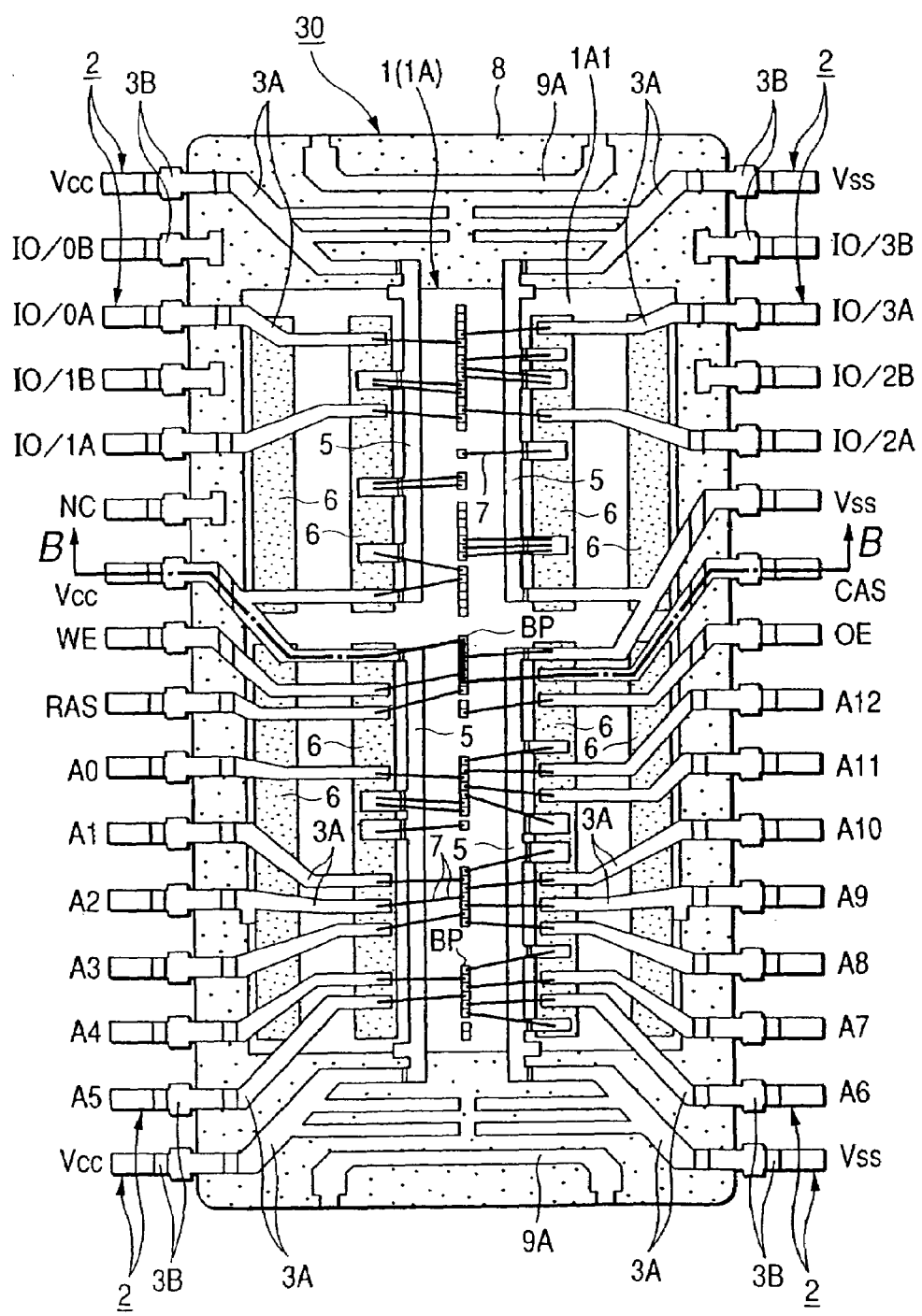
FIG. 11 is a plan view illustrating a state where the upper part is removed from the resin mold of the semiconductor device representing an embodiment 2 of the present invention.
Figure 12:
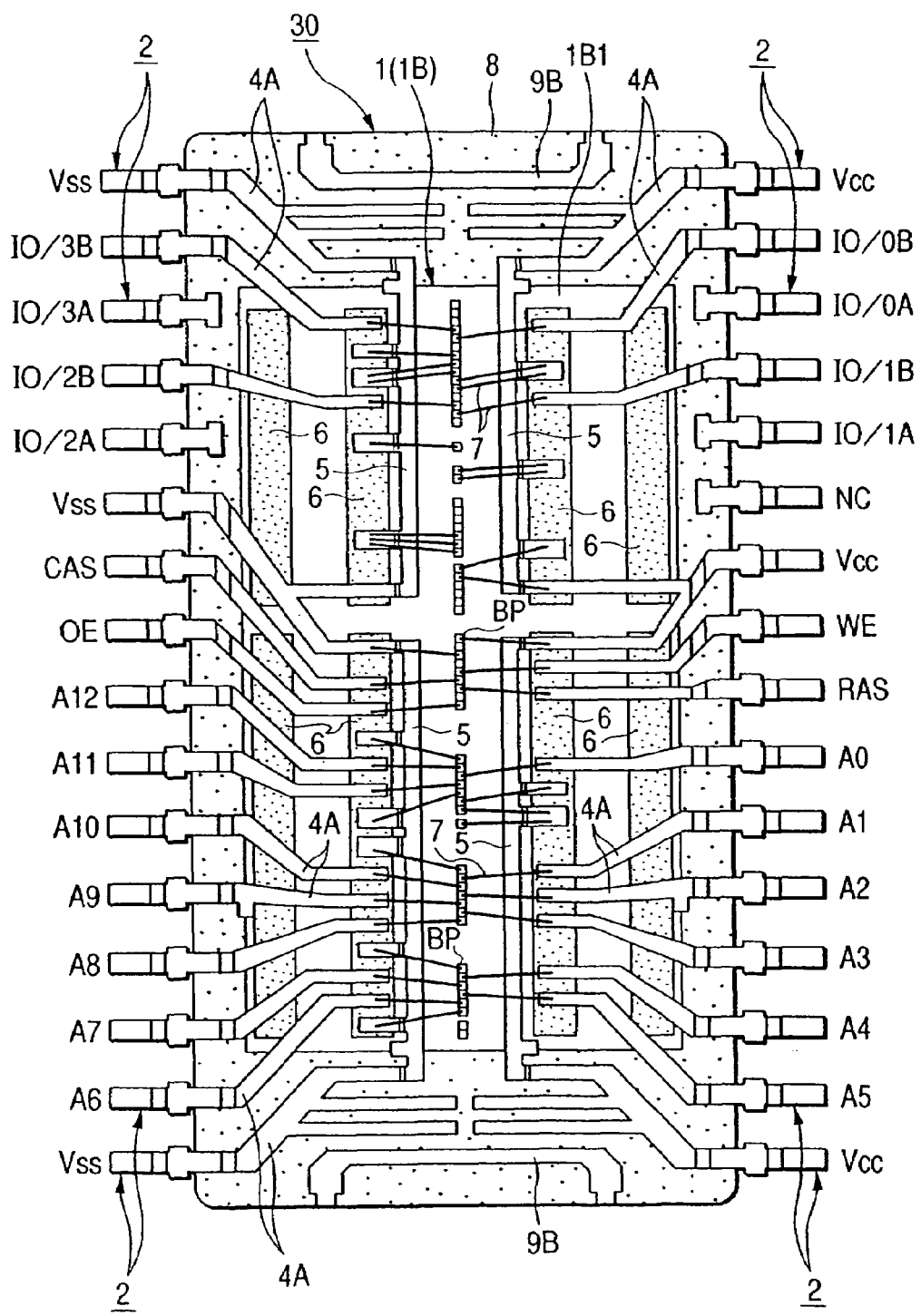
FIG. 12 is a bottom view illustrating a state where the lower part is removed from the resin mold of the semiconductor device.
Figure 13:
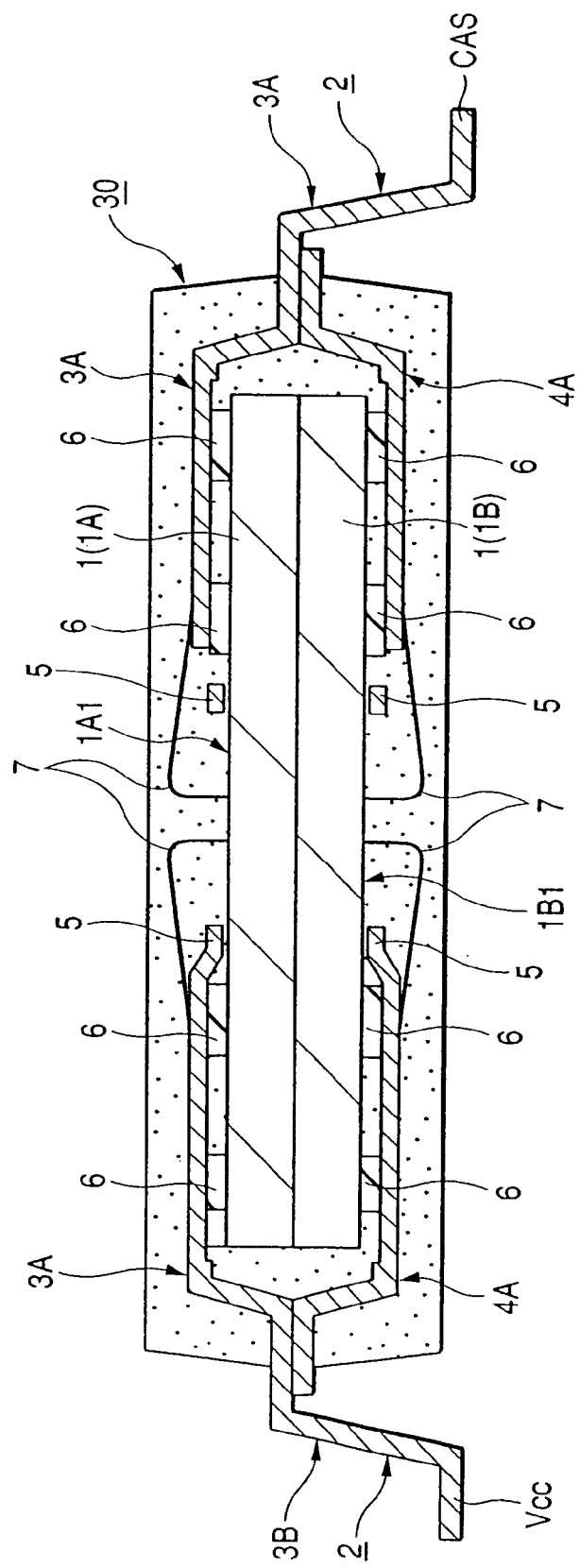
FIG. 13 is a sectional view cut along line B—B in FIG. 11.

FIG. 11 is a plan view illustrating a state where the upper part is removed from the resin mold of the semiconductor device of the present invention, FIG. 12 is a bottom view illustrating a state where the lower part is removed from the resin mold of the semiconductor device, and FIG. 13 is a sectional view cut along line B—B in FIG. 11.

As shown in FIGS. 11, 12 and 13, the semiconductor device 30 of this embodiment has nearly the same constitution as that of the above-mentioned embodiment 1. The constitution of this embodiment is different from the above-mentioned embodiment in the following respects. That is, the tip facing portion of the branch lead 3A, facing the circuit-forming surface 1A1 of the semiconductor chip 1A, has a thickness smaller than that of the other portions. Besides, the bus bar lead 5 integrated with the branch lead 3A has a decreased thickness like the tip facing portion of the branch lead 3A that is facing the chip. Furthermore, the tip facing portion of the branch lead 4B, facing the circuit-forming surface 1B1 of the semiconductor chip 1B, has a thickness smaller than the other portions. Moreover, the bus bar lead 5 integrated with the branch lead 4A has a decreased thickness like the tip facing portion of the branch lead 4A.

Furthermore, this embodiment is different from the above-mentioned embodiment 1 in that the position of the bus bar lead 5 is offset, so that the gap between the circuit-forming surface 1A1 of the semiconductor chip 1A and the bus bar lead 5 becomes smaller than the gap between the circuit-forming surface 1A1 of the semiconductor chip 1A and the branch lead 3A. Moreover, the position of the bus bar lead 5 is offset, so that the gap between the circuit-forming surface 1B1 of the semiconductor chip 1B and the bus bar lead 5 becomes smaller than the gap between the circuit-forming surface 1B1 of the semiconductor chip 1B and the branch lead 4A.

Figure 14:
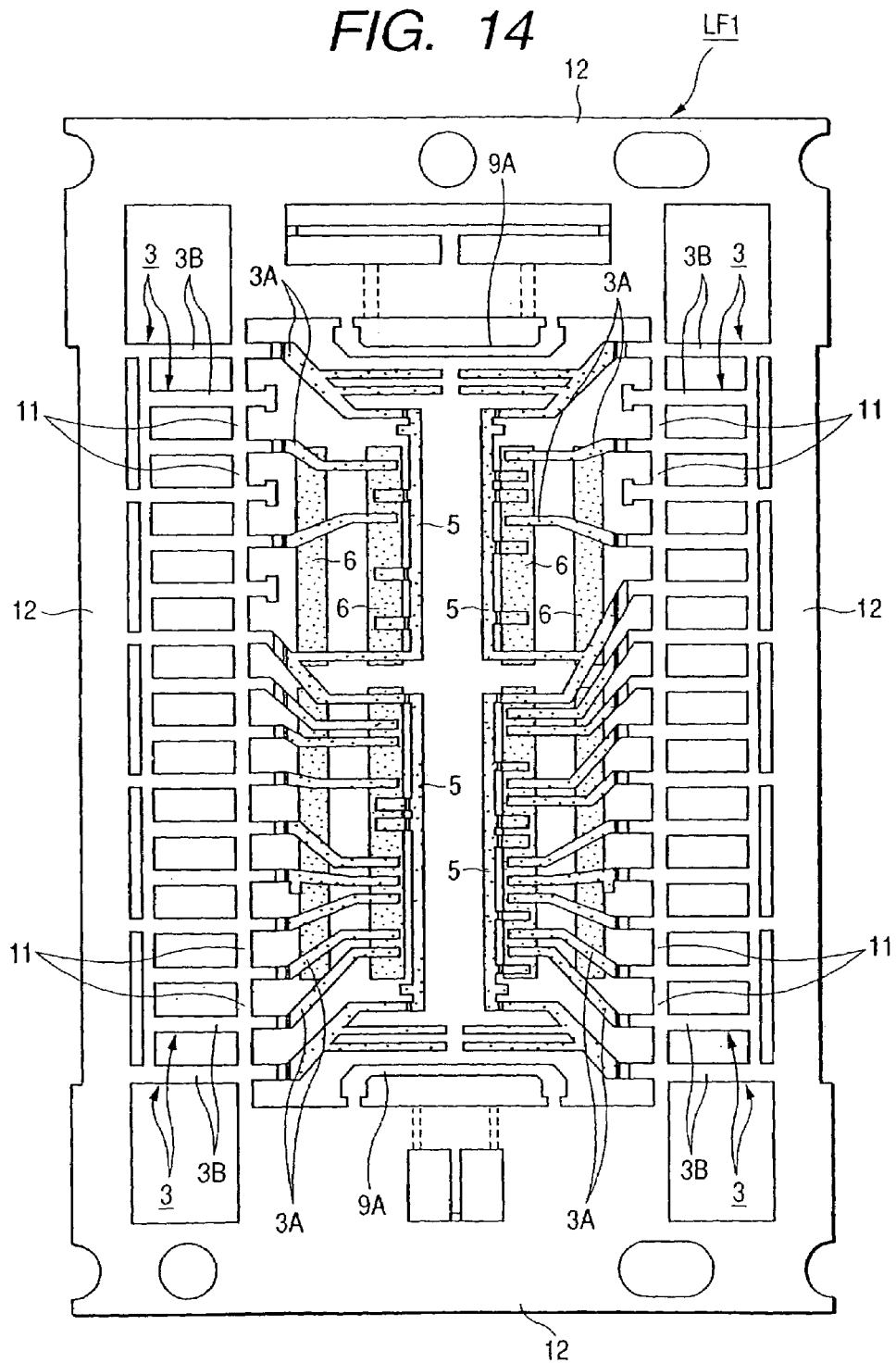
FIG. 14 is a plan view of a lead frame used in a process for producing the semiconductor device.

The thicknesses of the branch lead 3A facing the chip and the thickness of the bus bar lead 5 integrated with the branch lead 3A are decreased by subjecting the back surfaces thereof to half-etching at the stage of the lead frame. FIG. 14 is a plan view of the lead frame used in the process for producing the semiconductor device 30 of this embodiment, wherein the lead portions subjected to haft-etching are dotted.

Figure 15:
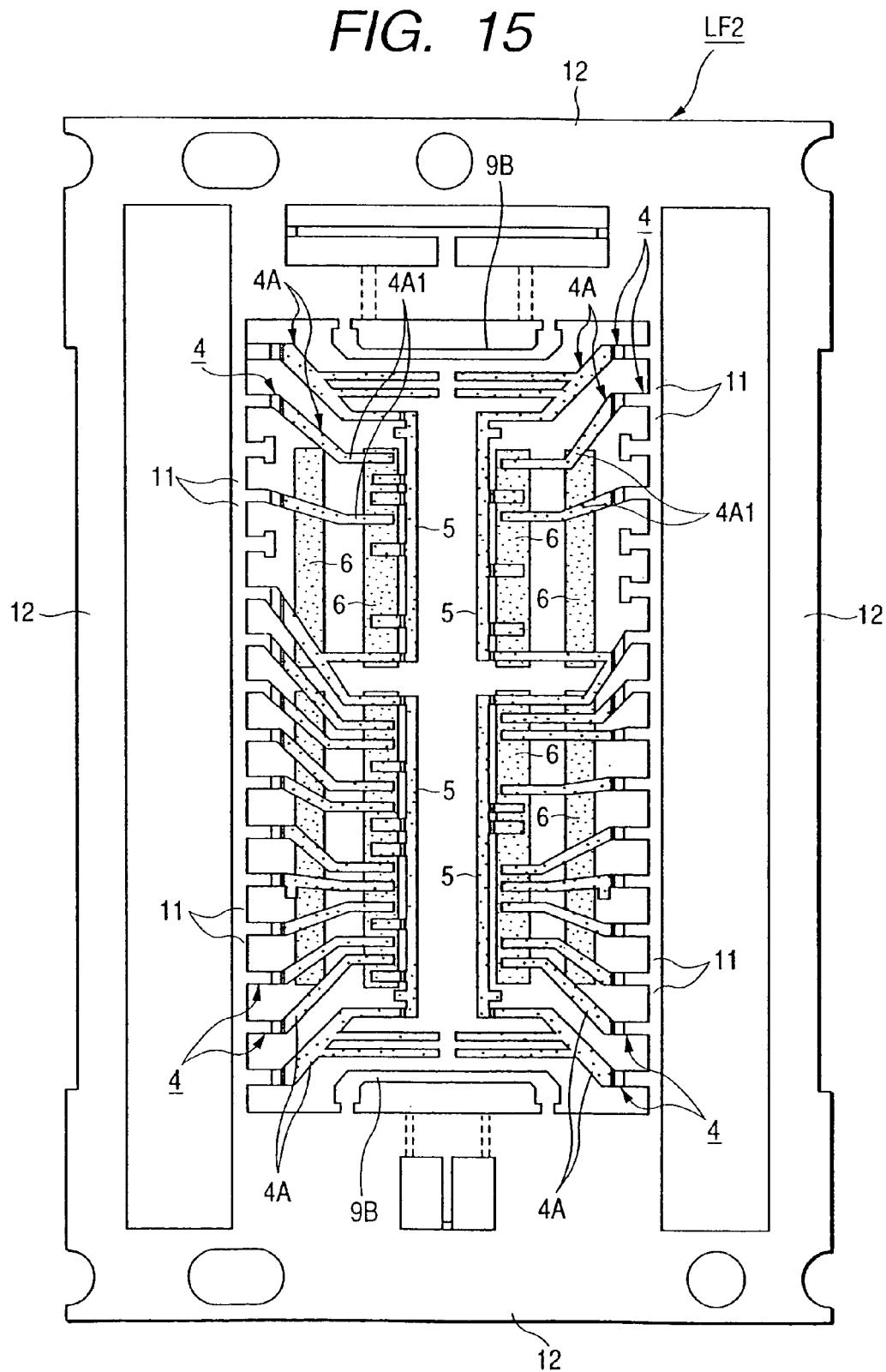
FIG. 15 is a plan view of the lead frame used in the process for producing the semiconductor device.

The thicknesses of the branch lead 4A facing the chip and the thickness of the bus bar lead 5 integrated with the branch lead 4A are decreased by subjecting the back surfaces thereof to half-etching at the stage of the lead frame. FIG. 15 is a plan view of the lead frame used in the process for producing the semiconductor device 30 of this embodiment, wherein the lead portions subjected to the haft-etching are dotted.

The bus bar lead 5 integrated with the branch lead 3A is offset by bending a portion where the branch lead 3A and the bus bar lead 5 are integrated together and by bending a portion where the bus bar lead 5 is integrated with the fixed lead that is integrated with the bus bar lead 5. Furthermore, the bus bar lead 5 integrated with the branch lead 4A is offset by bending a portion where the branch lead 4A and the bus bar lead 5 are integrated together and by bending a portion where the bu bar lead 5 is integrated with the fixed lead that is integrated with the bus bar lead 5. The bending is effected after the above-mentioned half-etching.

In order to prevent a short circuit between the end of the semiconductor chip 1A and the branch lead 3A and to prevent a short circuit between the end of the semiconductor chip 1B and the branch lead 4A, the branch lead 3A and the branch lead 4A are half-etched so that the steps formed by half-etching may be located on the outside of the ends of the semiconductor chip 1A and of the semiconductor chip 1B.

In the semiconductor device 30 of this embodiment as described above, the back surfaces of the branch lead 3A and of the branch lead 4A are subjected to half-etching, the tip facing portion of the thickness of the branch lead 3A, facing the circuit-forming surface 1A1 of the semiconductor chip 1A, is decreased compared with the other portions, and the thickness the tip facing portion of the branch lead 4A, facing the circuit-forming surface 1B1 of the semiconductor chip 1B, is decreased compared with the other portions, in order to decrease the thickness of the resin mold 8 on the circuit-forming surface 1A1 of the semiconductor chip 1A and to decrease the thickness of the resin mold 8 on the circuit-forming surface 1B1 of the semiconductor chip 1B. It is therefore possible to decrease the thickness of the resin mold 8 correspondingly. As a result, the thickness of the semiconductor device 30 can be further decreased.

Furthermore, the position of the bus bar lead 5 is offset, so that the gap between the circuit-forming surface 1A1 of the semiconductor chip 1A and the bus bar lead 5 becomes smaller than the gap between the circuit-forming surface 1A1 of the semiconductor chip 1A and the branch lead 3A and, besides, the position of the bus bar lead 5 is offset, so that the gap between the circuit-forming surface 1B1 of the semiconductor chip 1B and the bus bar lead 5 becomes smaller than the gap between the circuit-forming surface 1B1 of the semiconductor chip 1B and the branch lead 4A. Accordingly, the position of the surfaces (upper surfaces) of the bus bar leads 5 is lowered and, hence, the height of loops of the wires 7 jumping over the bus bar lead 5 can be lowered correspondingly, making it possible to decrease the thickness of the resin mold 8. As a result, the thickness of the semiconductor device 30 can be further decreased.

The back surfaces (lower surfaces) of the bus bar lead 5 integrated with the branch lead 3A and of the bus bar lead 5 integrated with the branch lead 4A are subjected to half-etching to decrease the thickness of the bus bar leads 5 and, hence, to increase the offset amount of the bus bar leads 5. Accordingly, the position of the surfaces of the bus bar leads 5 is further lowered, the height of the loops of the wires 7 jumping over the bus bar leads 5 is lowered, and the thickness of the semiconductor device 30 is further decreased.

Though the embodiment dealt with is an example where the back surfaces of the branch leads (3A, 4A) and of the bus bar leads 5 were subjected to half-etching, it is also possible to subject the front surfaces of the branch leads (3A, 4A) and of the bus bar leads 5 to half-etching.

Furthermore, though the embodiment dealt with is an example where the back surfaces of the branch leads (3A, 4A) and of the bus bar leads 5 were subjected to half-etching, the etching need not be limited to half-etching only.

Embodiment 3.

Figure 16:
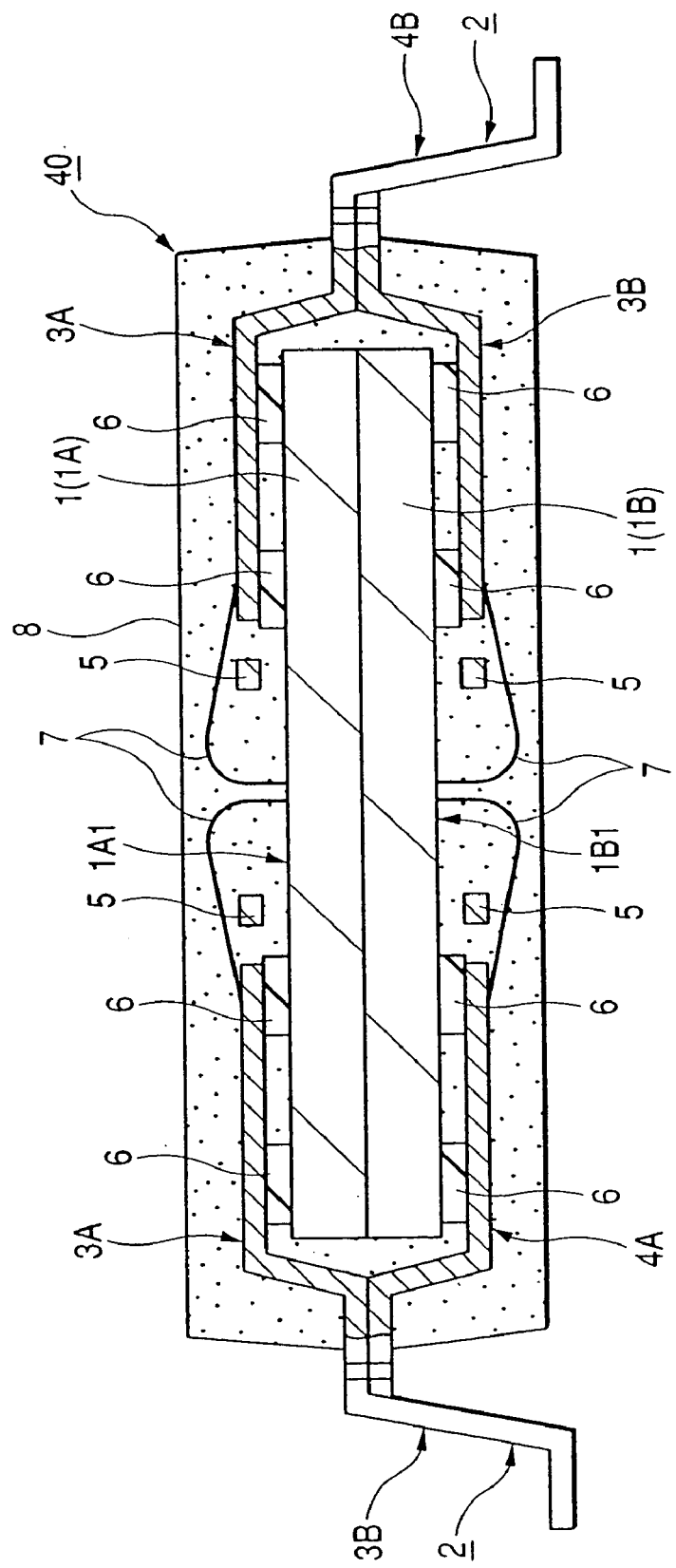
FIG. 16 is a sectional view of the semiconductor device representing an embodiment 3 of the present invention.
Figure 17:
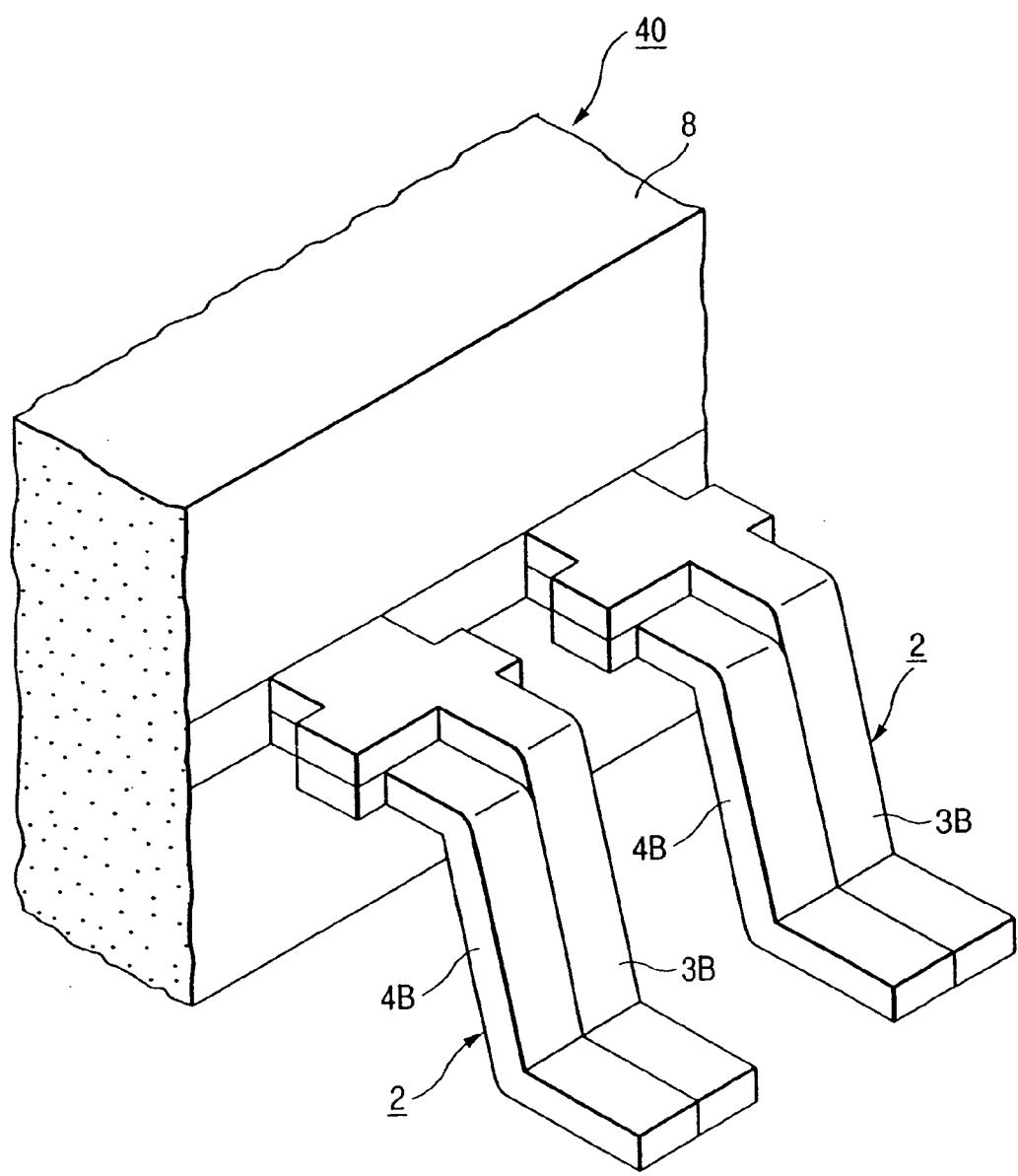
FIG. 17 is a perspective view illustrating a portion of the semiconductor device.

FIG. 16 is a sectional view of the semiconductor device of an embodiment 3 of the present invention, and FIG. 17 is a perspective view illustrating an essential portion of the semiconductor device.

Referring to FIGS. 16 and 17, the semiconductor device 40 of this embodiment is constituted by the resin mold 8, two semiconductor chips 1 positioned in the resin mold 8 and having external terminals BP arranged on the circuit-forming surfaces which are the front surfaces, and leads 2 extending from the inside to the outside of the resin mold 8. Each lead 2 is branched in the up-and-down direction in the resin mold 8 and has two branch leads (3A, 4A) that are bent. The one branch lead 3A is adhered and secured to the circuit-forming surface 1A1 which is the front surface of the one semiconductor chip 1A via the insulating film 6, and is electrically connected to the external terminal BP on the circuit-forming surface 1A1. The other branch lead 4A is adhered and secured to the circuit-forming surface 1B1 of the other semiconductor chip 1B via the insulating film 6, and is electrically connected to the external terminal BP on the circuit-forming surface 1B1.

The one branch lead 3A and the other branch lead 4A are stacked in the up-and-down direction in the resin mold 8.

The one branch lead 3A is led to the outside of the resin mold 8 and is integrated with the external lead 3B which is formed in a surface-mount shape, e.g., in a gull-wing shape. The other branch lead 4A is led to the outside of the resin mold 8 and is integrated with the external lead 4B which is formed in a surface-mount shape, e.g., in a gull-wing shape. The external lead 3B and the external lead 4B are arranged in parallel in the direction of the width of the leads in a region where they are bent in the gull-wing shape. Thus, the external lead 3B integrated with the branch lead 3A and the external lead 4B integrated with the branch lead 4A are arranged in parallel in the direction of the width of the leads thereby to constitute the external leads of the leads 2. Therefore, the external lead 3B and the external lead 4B can be joined by the solder at the time of mounting the semiconductor device 40 on the mounting substrate. In the process for producing the semiconductor device 40, therefore, the step of joining the external lead 3B and the external lead 4B can be omitted and, hence, the number of steps for producing the semiconductor device 40 can be decreased correspondingly.

Figure 18:
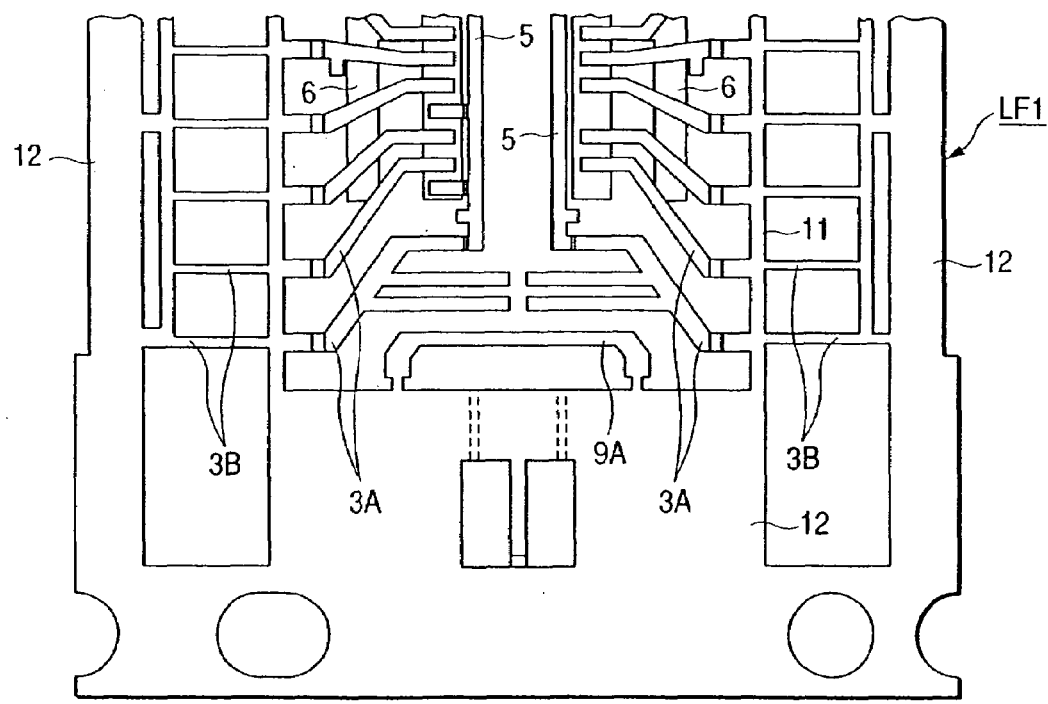
FIG. 18 is a plan view illustrating a portion of the lead frame used in the process for producing the semiconductor device.
Figure 19:
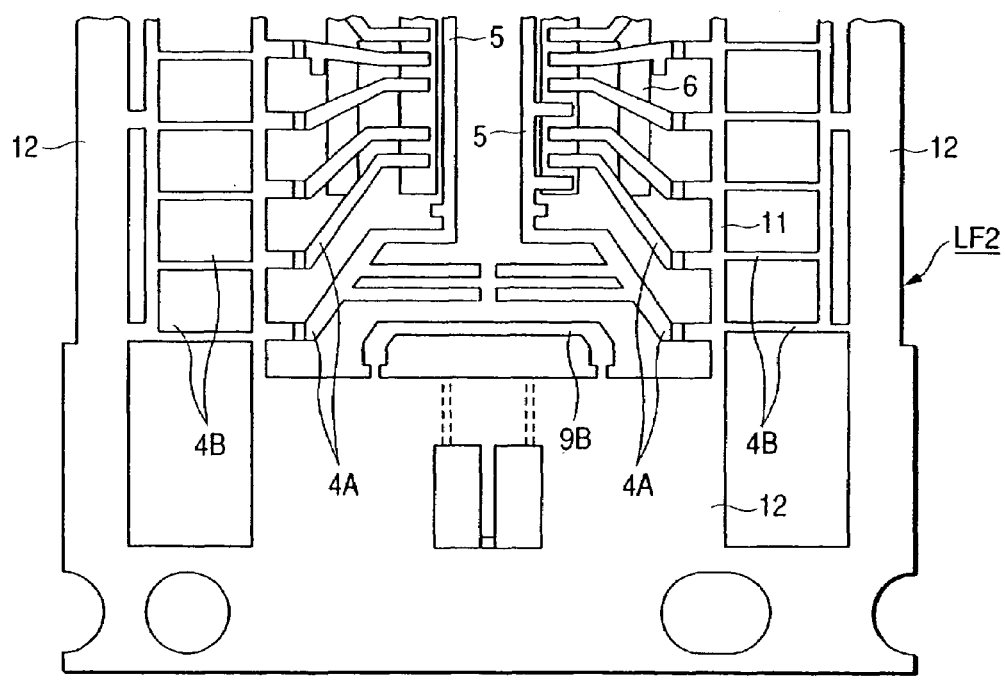
FIG. 19 is a plan view illustrating a portion of the lead frame used in the process for producing the semiconductor device.

The semiconductor device 40 is produced by a process by using the lead frame LF1 shown in FIG. 18 (plan view of an essential portion) and the lead frame LF2 shown in FIG. 19 (plan view of an essential portion). The external lead 3B of the lead frame LF1 and the external lead 4B of the lead frame LF2 have narrow widths so that they will not be overlapped with each other when the back surfaces of the lead frames LF1 and LF2 are mated with each other. Upon mating the back surfaces of the lead frames LF1 and LF2 with each other, and upon bending the external lead 3B and the external lead 4B is such a way as to be arranged in parallel in the direction of the width of the leads in the bent region, there are formed the leads 2 constituted by the external leads 3B and the external leads 4B arranged in parallel in the direction of the width of the leads.

In the lead frame LF1 of this embodiment like in the above-mentioned embodiment 2, the position of the bus bar lead 5 is offset so that the gap between the circuit-forming surface 1A1 of the semiconductor chip 1A and the bus bar lead 5 may be smaller than the gap between the circuit-forming surface 1A1 of the semiconductor chip 1A and the branch lead 3A. In the lead frame LF2 of this embodiment like in the above-mentioned embodiment 2, furthermore, the position of the bus bar lead 5 is offset so that the gap between the circuit-forming surface 1B1 of the semiconductor chip 1B and the bus bar lead 5 may be smaller than the gap between the circuit-forming surface 1A1 of the semiconductor chip 1B and the branch lead 4A.

In this embodiment like in the above-mentioned embodiment 1, the branch lead 3A and the branch lead 4A have constant thicknesses. Like in the above-mentioned embodiment 2, however, the back surfaces or the front surfaces of the branch lead 3A and of the branch lead 4A may be subjected to half-etching so that the tip facing portion of the branch lead 3A, facing the circuit-forming surface 1A1 of the semiconductor chip 1A, will have a thickness smaller than that of the other portions and the tip facing portion of the branch lead 4A, facing the circuit-forming surface 1B1 of the semiconductor chip 1B, will have a thickness smaller than that of the other portions. Moreover, the back surfaces or the front surfaces of the bus bar leads 5 may be subjected to half-etching so that the bus bar leads 5 will have a decreased thickness like the tip facing portions of the branch leads (3A, 4A).

Embodiment 4.

This embodiment is an example where the present invention is applied to a semiconductor device of the TSOP type having a bidirectional lead arrangement structure.

Figure 20:
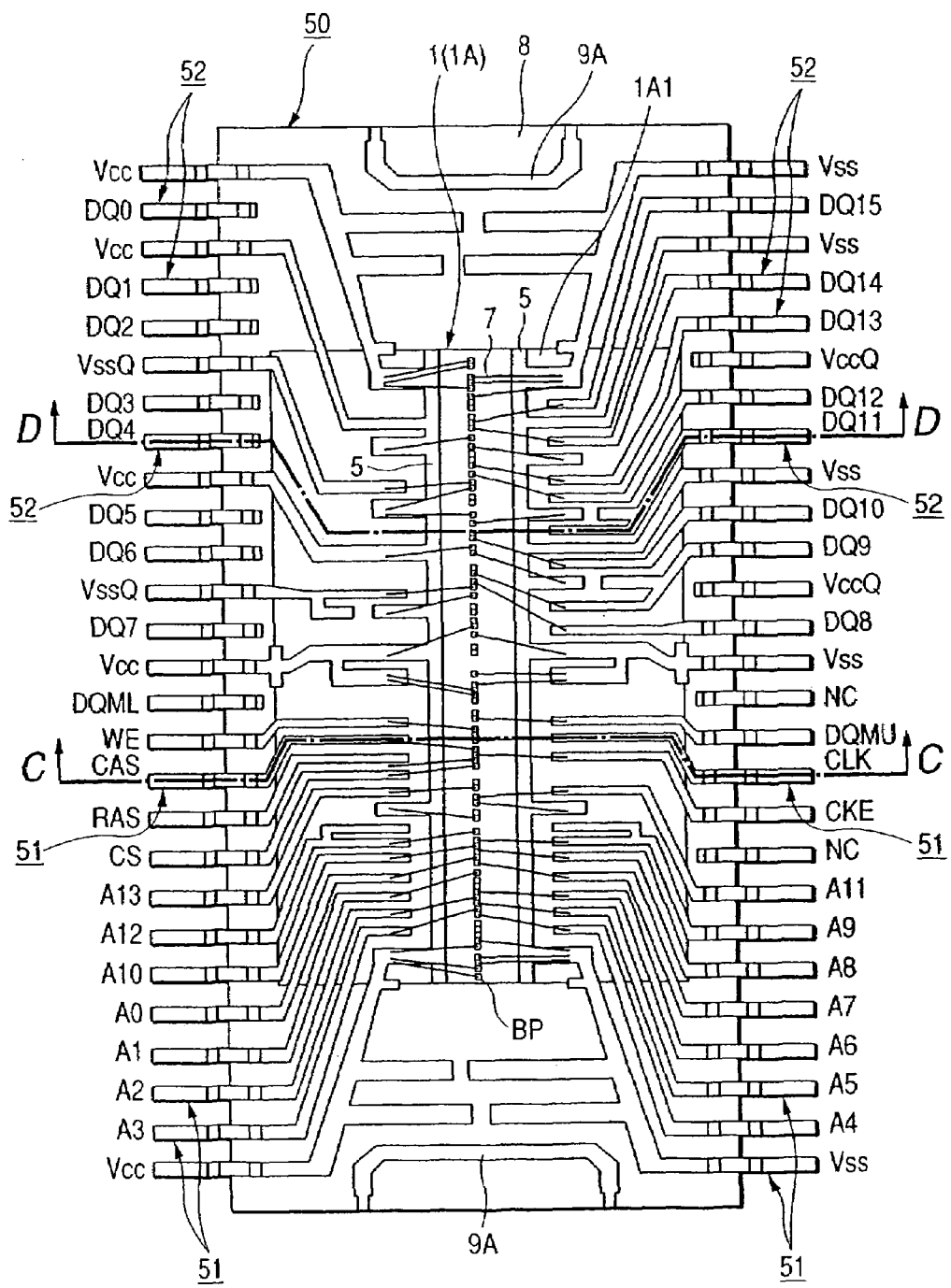
FIG. 20 is a plan view illustrating a state where the upper part is removed from the resin mold of the semiconductor device representing an embodiment 4 of the present invention.
Figure 21:
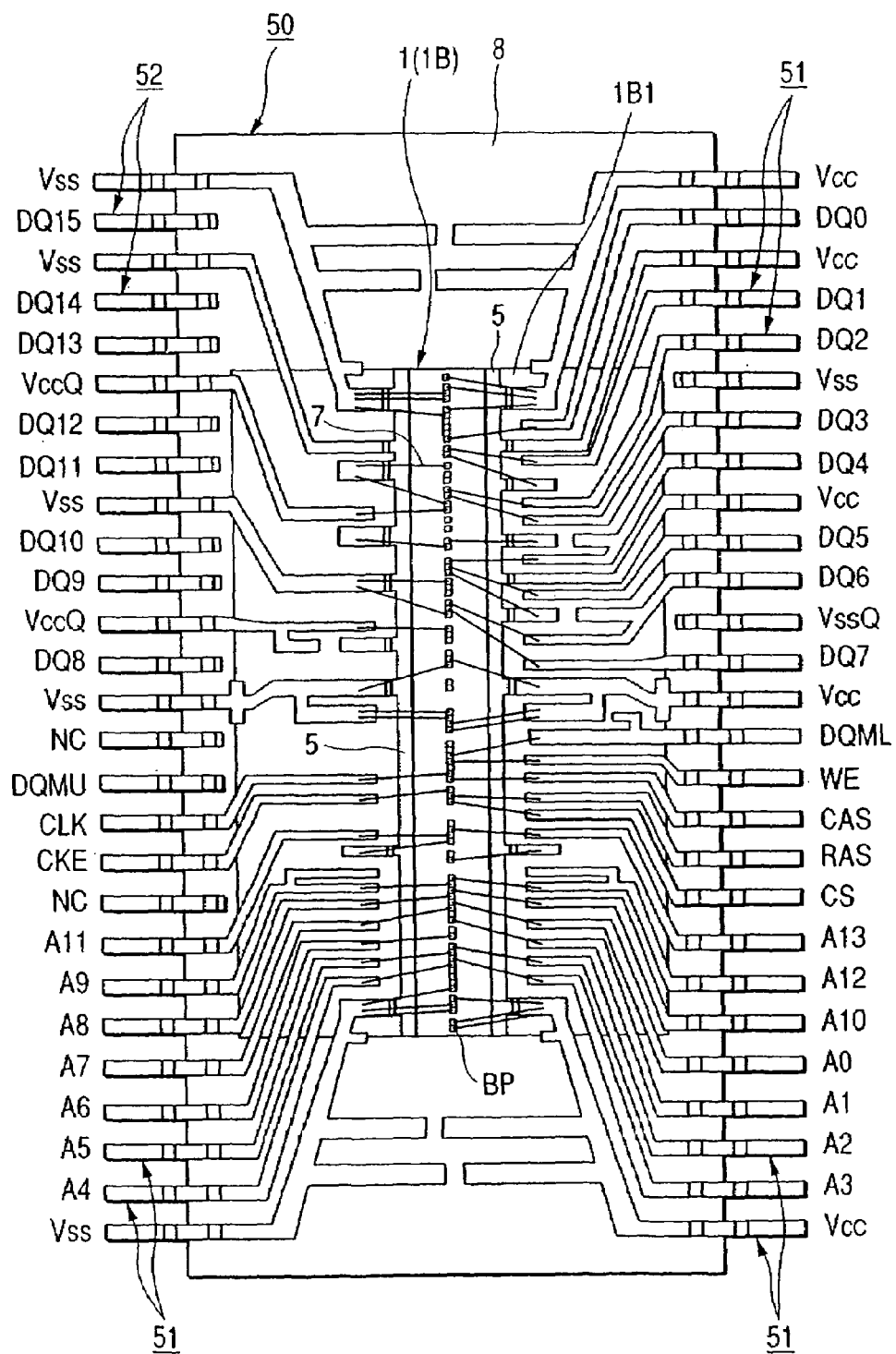
FIG. 21 is a bottom view illustrating a state where the lower part is removed from the resin mold of the semiconductor device.
Figure 22:
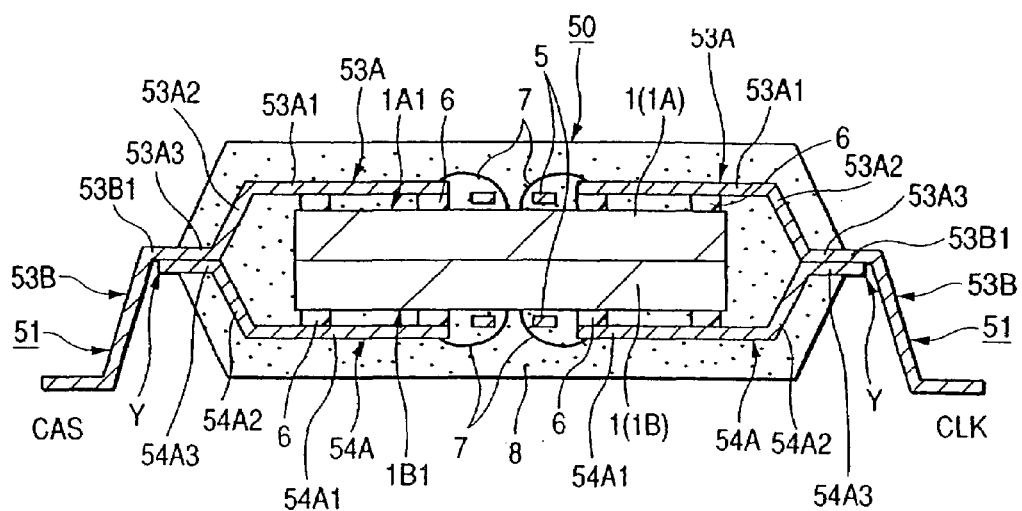
FIG. 22 is a sectional view cut along line C—C in FIG. 20.
Figure 23:
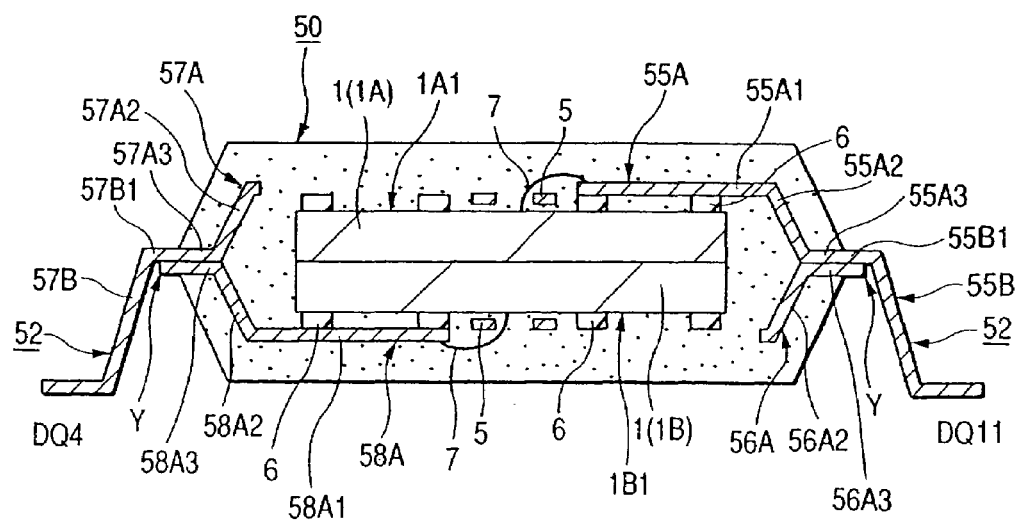
FIG. 23 is a sectional view cut along line D—D in FIG. 20.

FIG. 20 is a plan view illustrating a state where the upper part is removed from the resin mold of the semiconductor device of an embodiment 4 of the present invention, FIG. 21 is a bottom view illustrating a state where the lower part is removed from the resin mold of the semiconductor device, FIG. 22 is a sectional view cut along line C—C in FIG. 20, and FIG. 23 is a sectional view cut along line D—D in FIG. 19. For easy comprehension of the drawings, the insulating film 6 is omitted in FIGS. 20 and 21.

As shown in FIGS. 20, 21 and 22, the semiconductor device 50 of this embodiment is constituted by stacking two semiconductor chips 1 one upon the other, which are then molded with resin. The two semiconductor chips 1 are stacked in a state where their back surfaces are opposed to each other.

The two semiconductor chips 1 are so formed as to have the same external size. Though there is no particular limitation as to shape, the two semiconductor chips 1 have, for example, a rectangular planar shape.

In each of the two semiconductor chips 1 there are provided a synchronous DRAM (hereinafter simply referred to as SDRAM) of 64 megabits, as a memory circuit system, to which signals are input/output in synchronism with the clock signals.

A plurality of external terminals (bonding pads) BP are formed along the long side of a rectangle at the central portion of the circuit-forming surface 1A1 which is the front surface of one semiconductor chip 1A out of the two semiconductor chips 1. Furthermore, a plurality of external terminals BP are formed along the long side of a rectangle at the central portion of the circuit-forming surface 1B1 which is the front surface of the other semiconductor chip out of the two semiconductor chips 1.

The circuit pattern of the SDRAM constituted in the one semiconductor chip 1A is the same as the circuit pattern of the SDRAM constituted in the other semiconductor chip 1B. Moreover, the external terminals BP are arranged on the circuit-forming surface 1A1 of the one semiconductor chip 1A in the same pattern as that of the external terminals BP arranged on the circuit-forming surface 1B1 of the other semiconductor chip 1B. That is, the two semiconductor chips 1 have the same structure.

Though there is no particular limitation, the resin mold 8 has, for example, a rectangular planar shape. A plurality of leads 51 and a plurality of leads 52 are arranged on the outer sides of the two long opposing sides of the resin mold 8 along the long sides. The plurality of leads 51 and the plurality of leads 52 extend from the inside to the outside of the resin mold 8. The group of leads on the right side shown in FIG. 20 corresponds to the group of leads of the left side shown in FIG. 21, and the group of leads on the left side shown in FIG. 20 corresponds to the group of leads of the right side shown in FIG. 21.

Terminal names are given to the plurality of leads 51 and of the plurality of leads 52. A terminal Vcc and a terminal VccQ are power source potential terminals fixed to a power source potential (e.g., 5 V). A terminal Vss and a terminal VssQ are reference potential terminals fixed to a reference potential (e.g., 0 V).

A terminal DQ0 to a terminal DQ15 are data input/output terminals. A terminal A0 to a terminal A13 are address input terminals. A terminal CS is a chip select terminal. A terminal RAS is a row address strobe terminal. A terminal CAS is a column address strobe terminal. A terminal WE is a read/write enable terminal. A terminal DQMU and a terminal DQML are input/output mask terminals. A terminal CLK is a clock input terminal. A terminal CKE is a clock enable terminal. A terminal NC is a free terminal.

The lead 51 which is the terminal CLK and the lead 51 which is the terminal CAS are branched in the up-and-down direction (direction in which the chips are stacked) in the resin mold 8 as shown in FIG. 22, and have two branch leads (53A, 54A) which are bent, respectively.

The one branch lead 53A is constituted by a first portion 53A1 that extends on the circuit-forming surface 1A1 of the one semiconductor chip 1A traversing the one side of the circuit-forming surface 1A1 of the one semiconductor chip 1A, a second portion 53A2 bent from the first portion 53A1 toward the back surface side of the one semiconductor chip 1A, and a third portion 53A3 bent from the second portion 53A2 toward the outer side of the one semiconductor chip 1A. The first portion 53A1 is adhered and secured to the circuit-forming surface 1A1 of the semiconductor chip 1A through the insulating film 6. The end of the first portion 53A1 is disposed near the external terminal BP (see FIG. 20) formed at the central portion of the circuit-forming surface 1A1 of the semiconductor chip 1A, and is electrically connected to the external terminal BP of the semiconductor chip 1A through a wire 7.

The other branch lead 54A is constituted by a first portion 54A1 that extends on the circuit-forming surface 1B1 of the other semiconductor chip 1B traversing the one side of the circuit-forming surface 1B1 of the other semiconductor chip 1B, a second portion 54A2 bent from the first portion 54A1 toward the back surface side of the other semiconductor chip 1B, and a third portion 54A3 bent from the second portion 54A2 in such a way as to be superposed on the third portion 53A3 of the one branch lead 53A. The first portion 54A1 is adhered and secured to the circuit-forming surface 1B1 of the semiconductor chip 1B through the insulating film 6. The end of the first portion 54A1 is disposed near the external terminal BP (see FIG. 21) formed at the central portion of the circuit-forming surface 1B1 of the semiconductor chip 1B, and is electrically connected to the external terminal BP of the semiconductor chip 1B through a wire 7.

The third portion 53A1 of the branch lead 53A is led to the outside from the resin mold 8 and is integrated with the external lead 53B. The third portion 54A3 of the branch lead 54A is joined at its end to the root portion 53Ba of the external lead 53B, and is electrically and mechanically connected thereto. That is, the lead 51 which is the terminal CLK and the lead 51 which is the terminal CAS are electrically connected to the external terminals BP of the two semiconductor chips 1, respectively.

The lead 51 which is the terminal Vcc, the lead 51 which is the terminal Vss, the leads 51 which are the terminals A0 to A15, the lead 51 which is the terminal CS, the lead 51 which is the terminal RAS, the lead 51 which is the terminal WE, and the lead 51 which is the terminal CKE, are constituted similarly to the lead 51 which is the terminal CLK, and are electrically connected to the external terminals BP of the two semiconductor chips 1.

Referring to FIG. 23, the lead 52 which is the terminal DQ11 is branched in the up-and-down direction (in which the chips are stacked) in the resin mold 8 so as to have two branch leads (55A, 56A) that are bent.

The one branch lead 55A is constituted by a first portion 55A1 that extends on the circuit-forming surface 1A of the one semiconductor chip 1A traversing the one side of the circuit-forming surface 1A1 of the one semiconductor chip 1A, a second portion 55A2 bent from the first portion 55A1 toward the back surface side of the one semiconductor chip 1A, and a third portion 55A3 bent from the second portion 55A2 toward the outer side of the one semiconductor chip 1A. The first portion 55A1 is adhered and secured to the circuit-forming surface 1A1 of the semiconductor chip 1A via the insulating film 6. The end of the first portion 55A1 is disposed near the external terminal BP (see FIG. 20) formed at the central portion of the circuit-forming surface 1A1 of the semiconductor chip 1A, and is electrically connected to the external terminal BP of the semiconductor chip 1A through a wire 7.

Unlike the other branch lead 54A of the lead 51 shown in FIG. 22, the other branch lead 56A is formed in a shape from which the first portion that extends on the circuit-forming surface 1B1 of the semiconductor chip 1B has been removed. That is, the branch lead 56A is chiefly constituted by a lead portion 56A2 that extends from the circuit-forming surface 1B1 side of the other semiconductor chip 1B toward the back surface side thereof, and a lead portion 56A3 which is bent from the lead 56A2 in such a way as to be superposed on the third portion 55A3 of the one branch lead 55A.

The third portion 55A1 of the branch lead 55A is integrated with the external lead 55B that is led to the outside from the resin mold 8. The lead portion 56A3 of the branch lead 56A is joined at its end to the root portion 55B1 of the external lead 55B, and is electrically and mechanically connected thereto. That is, the lead 52 which is the terminal DQ11 is not electrically connected to the external terminal BP of the other semiconductor chip 1B.

The leads 52 which are the terminals DQ8 to DQ10, the leads 52 which are the terminals DQ12 to DQ15, and the lead 52 which is the terminal DQMU, are constituted similarly to the lead 52 which is the terminal DQ11, but are not electrically connected to the external terminals BP of the other semiconductor chip 1B. Among the terminals VccQ and VssQ, furthermore, the lead 52 which is the terminal VccQ in the lead arrangement of the left side in FIG. 20 and the lead 52 which is the terminal VssQ in the lead arrangement of the left side in FIG. 20, are constituted similarly to the lead 52 which is the terminal DQ11, but are not electrically connected to the external terminals BP of the other semiconductor chip 1B.

Referring to FIG. 23, the lead 52 which is the terminal DQ4 is branched in the up-and-down direction (in which the chips are stacked) in the resin mold 8 so as to have two branch leads (57A, 58A) that are bent.

Unlike the one branch lead 53A of the lead 51 shown in FIG. 22, the one branch lead 57A is formed in a shape from which the first portion that extends on the circuit-forming surface 1A1 of the semiconductor chip 1A is removed. That is, the branch lead 57A is chiefly constituted by a lead portion 57A2 that extends from the side of the circuit-forming surface 1A1 of the one semiconductor chip 1A toward the back surface side thereof, and a lead portion 57A3 that is bent from the lead 57A2 toward the outer side of the one semiconductor chip 1A.

The other branch lead 58A is constituted by a first portion 58A1 that extends on the circuit-forming surface 1B of the other semiconductor chip 1B traversing the one side of the circuit-forming surface 1B1 of the other semiconductor chip 1B, a second portion 58A2 bent from the first portion 58A1 toward the back surface side of the other semiconductor chip 1B, and a third portion 58A3 bent from the second portion 58A2 in such a way as to be superposed on the lead portion 57A3 of the one branch lead 57A. The first portion 58A1 is adhered and secured to the circuit-forming surface 1B1 of the semiconductor chip 1B through the insulating film 6. The end of the first portion 58A1 is disposed near the external terminal BP formed at the central portion of the circuit-forming surface 1B1 of the semiconductor chip 1B, and is electrically connected to the external terminal BP (see FIG. 21) of the semiconductor chip 1B through an electrically conductive wire 7.

The lead portion 57A1 of the branch lead 57A is integrated with the external lead 57B led to the outside from the resin mold 8. The third portion 58A3 of the branch lead 58A is joined at its end to the root portion 57B1 of the external lead 57B, and is electrically and mechanically connected thereto. That is, the lead 52 that is the terminal Q4 is not electrically connected to the external terminal BP of the one semiconductor chip 1B.

The leads 52 which are the terminals DQ0 to DQ3, the leads 52 which are the terminals DQ5 to DQ7, and the lead 52 which is the terminal DQMU, are constituted similarly to the lead 52 which is the terminal DQ4, but are not electrically connected to the external terminals BP of the one semiconductor chip 1A. Among the terminals VccQ and VssQ, the lead 52 which is the terminal VccQ in the lead arrangement of the right side in FIG. 19 and the lead 52 which is the terminal VssQ in the lead arrangement of the right side in FIG. 19 are constituted similarly to the lead 52 which is the terminal DQ4, but are not electrically connected to the external terminals BP of the other semiconductor chip 1B.

The one branch lead 53A of the lead 51 which is the terminal Vcc and the one branch lead 53A of the lead 51 which is the terminal Vss, extend on the circuit-forming surface 1A1 of the semiconductor chip 1A in the direction in which the external terminals BP are arranged, and are integrated with the bus bar lead 5 arranged between the end of the other branch lead 3A and the external terminal BP. The bus bar lead 5 is integrated with the fixed lead which is adhered and secured, via the insulating film 6, to the circuit-forming surface 1A1 of the semiconductor chip 1A. The fixed lead is electrically connected to the external terminal BP of the semiconductor chip 1A via a wire 7.

The other branch lead 54A of the lead 51 which is the terminal Vcc and the other branch lead 54A of the lead 51 which is the terminal Vss, extend on the circuit-forming surface 1B1 of the semiconductor chip 1B in the direction in which the external terminals BP are arranged, and are integrated with the bus bar lead 5 arranged between the end of the other branch lead 4A and the external terminal BP. The bus bar lead 5 is integrated with the fixed lead which is adhered and secured, via the insulating film 6, to the circuit-forming surface 1B1 of the semiconductor chip 1B. The fixed lead is electrically connected to the external terminal BP of the semiconductor chip 1B via a wire 7.

Figure 24:
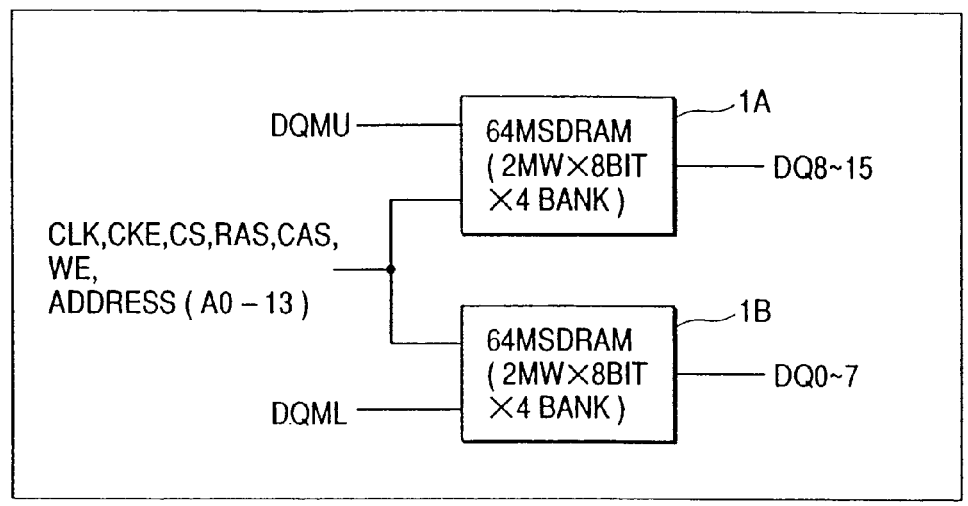
FIG. 24 is a block diagram of the semiconductor device.

Referring to FIG. 24 (block diagram), the terminals CLK, CKE, CS, RAS, CAS, WE, and A0 to A13 are electrically connected to the two semiconductor chips (1A, 1B). The terminals DQMU and DQ8 to DQ15 are electrically connected to the one semiconductor chip 1A, and the terminals DQML and DQ0 to DQ7 are electrically connected to the other semiconductor chip 1B. That is, in the semiconductor device 50 of this embodiment, the SDRAMs constituted in the two semiconductor chips 1 operate simultaneously.

In the semiconductor device 50, the leads (terminals CLK, CKE, CS, RAS, CAS, WE and A0 to A13) electrically connected to the external terminals BP of the two semiconductor chips 1, each have two branch leads branched in the up-and-down direction in the resin mold 8 and extending on the circuit-forming surfaces of the two semiconductor chips 1 and are adhered and secured to the circuit-forming surfaces.

Meanwhile, the leads (terminals DQMU, DQML, DQ0 to DQ15) 52 electrically connected to the external terminals BP of either one of the two semiconductor chips 1, are extended on the circuit-forming surface of either one of the two semiconductor chips 1 and are adhered and secured onto the circuit-forming surface thereof.

Therefore, the stray capacitance (chip-lead capacitance) added to the lead 52 becomes smaller than the stray capacitance (chip-lead capacitance) added to the lead 51. Accordingly, the signal propagation speed of the lead 52 increases, and the semiconductor device 50 exhibits improved electric characteristics.

In the case of the semiconductor chip 1 in which the external terminals BP are arranged at the central portion of the circuit-forming surface, in particular, the ends of the leads must be extended near to the central portion of the semiconductor chip 1 resulting in an increase in the areas where the leads are opposed to the circuit-forming surface of the semiconductor chip 1. In the semiconductor device 50 employing the LOC structure, therefore, it is important to form the lead using a single lead that is electrically connected to the external terminal BP of either one of the two semiconductor chips 1.

Figure 25:
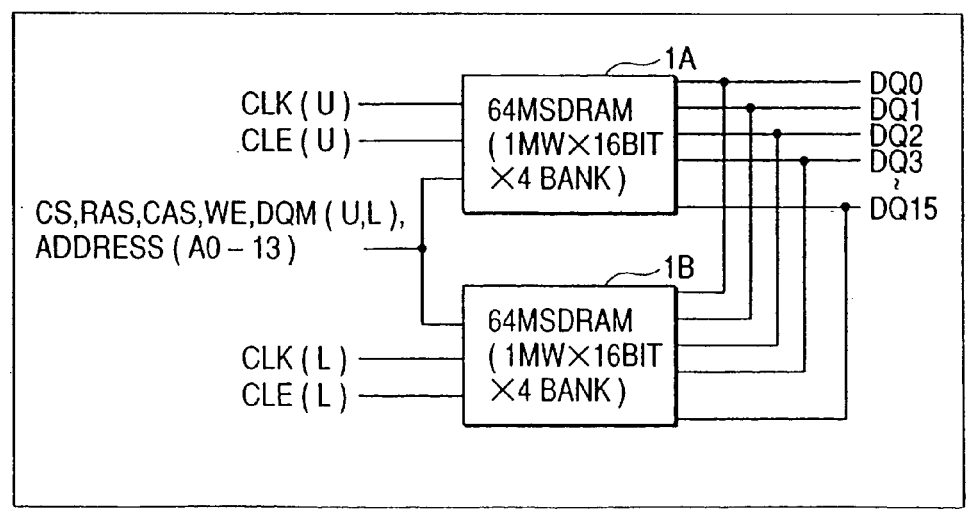
FIG. 25 is a block diagram of the semiconductor device representing an embodiment which is a modification of the embodiment 4 of the present invention.

Though this embodiment is an example where the semiconductor device 50 is so constituted that the SDRAMs constituted in the two semiconductor chips 1 operates simultaneously, it is also possible, as shown in FIG. 25 (block diagram), to form the terminals CS, RAS, CAS, WE, DQM, A0 to A13, DQ0 to DQ15 in common, and independently form the terminals CLK and CLE. In this case, the SDRAMs constituted in the two semiconductor chips 1 can be independently controlled, making it possible to decrease the amount of heat generated by the semiconductor device 50 and to decrease the amount of electric power consumed by the whole system incorporating the semiconductor devices 50.

Figure 26:
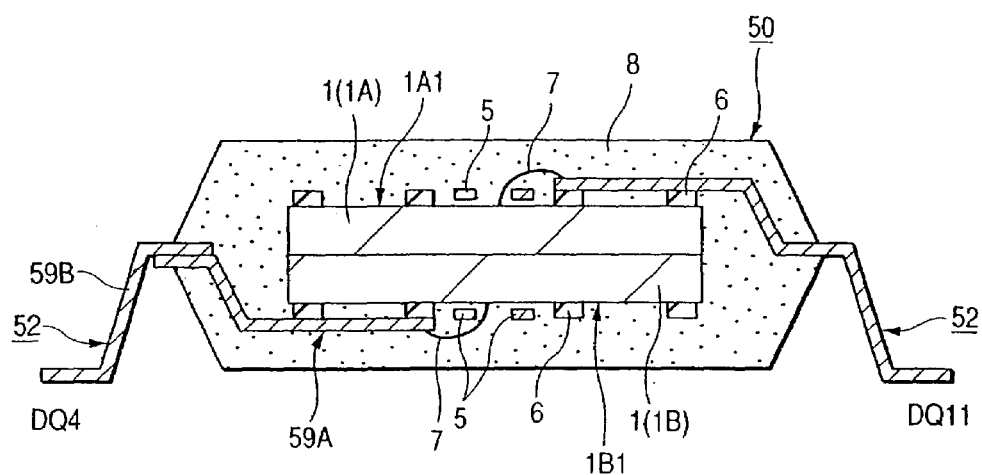
FIG. 26 is a sectional view of the semiconductor device representing an embodiment which is a modification of the embodiment 4 of the present invention.

In this embodiment as shown in FIG. 23, furthermore, the one branch lead 57A is constituted by the lead portion 57A2 and the lead portion 57A3 in the lead 52 that is not electrically connected to the external terminal BP of the one semiconductor chip 1A, and the other branch lead 56A is constituted by the lead portion 56A2 and the lead portion 56A3 in the lead 52 that is not electrically connected to the external terminal BP of the other semiconductor chip 1B. As shown in FIG. 26, however, the lead 52 that is not electrically connected to the external terminal BP of the one semiconductor chip 1A may be constituted by the lead member 59A partly led to the outside of the resin mold 8 and by the lead member 59B partly introduced into the resin mold 8, and the lead 52 that is not electrically connected to the external terminal BP of the other semiconductor chip 1B may be constituted by a single lead that extends within the interior of the resin mold 8. In this case, the stray capacitance (chip-lead capacitance) added to the lead 52 is further decreased, and the semiconductor device 50 exhibits further improved electric characteristics.

Embodiment 5.

Figure 27:
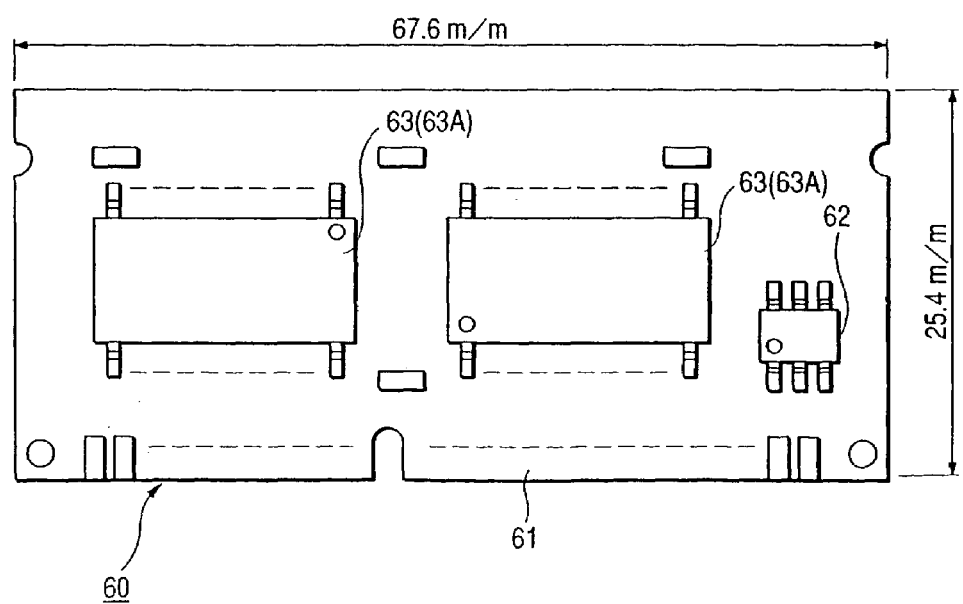
FIG. 27 is a plan view of the electronic apparatus representing an embodiment 5 of the present invention.

FIG. 27 is a plan view of a memory module (electronic device) of an embodiment 5 of the present invention, and FIG. 28 is a sectional view of the memory module.

As shown in FIGS. 27 and 28, the memory module 60 is constituted by mounting two semiconductor devices 63 and one semiconductor device 62 on the front surface out of the front surface and the back surface of the wiring board 61, and mounting two semiconductor devices 63 on the back surface out of the front surface and the back surface of the wiring board 61. SDRAMs, for example, are mounted as memory circuit systems in the four semiconductor devices 63. A control circuit system is mounted in the one semiconductor device 62 to control the memory circuit systems of the four semiconductor devices 63.

The four semiconductor devices 63 are stacked in a state where the back surfaces of each pair of semiconductor chips 1 are opposed to each other and molded with resin 8. Basically, the four semiconductor devices 63 are constituted nearly similarly to the semiconductor device 50 of the above-mentioned embodiment 4.

Among the four semiconductor devices 63, one pair of semiconductor devices 63A are mounted on the front surface of the wiring board 61, and the other of semiconductor devices 63B are mounted on the back surface of the wiring board 61.

Referring to FIG. 28, the semiconductor device 63A has a lead 64A which is the terminal DQ11 led from one side surface 8a out of the two opposing side surfaces of the resin mold 8, and has a lead 64A which is the terminal DQ4 led from the other side surface 8b. Referring to FIG. 28, furthermore, the semiconductor device 63B has a lead 64B which is the terminal DQ11 led from the one side surface 8a out of the two opposing side surfaces of the resin mold 8, and has a lead 64B which is the terminal DQ4 led from the other side surface 8b. The lead 64B which is the terminal DQ4 of the semiconductor device 63B is opposed to the lead 64A which is the terminal DQ4 of the semiconductor device 64A, and the lead 64B which is the terminal DQ11 of the semiconductor device 63B is opposed to the lead 64A which is the terminal DQ11 of the semiconductor device 64A. Usually, when the semiconductor devices of the same structure are mounted on both surfaces of the wiring board, the leads having different functions are opposed to each other. By laterally reversing the connection of wires 7, however, the semiconductor devices 63 can be mounted on both surfaces of the wiring board 61 in a state where leads having the same functions are opposed to each other.

Since the semiconductor devices 63 can be mounted on both surfaces of the wiring board 61 in a state where leads having the same functions are opposed to each other, it is possible to decrease the number of the wiring layers on the wiring board 61 and, hence, to decrease the thickness of the memory module 60.

By stacking the two semiconductor chips 1 in which are constituted the SDRAMs of the same capacity and by mounting, on the wiring board 61, the semiconductor device 63 formed by molding the two semiconductor chips 1 with resin 8, furthermore, it is possible to double the capacity of the memory module 60 without increasing the area of the mounting board 61.

When the leads having the same functions are opposed to each other by laterally reversing the connection of the wires 7, it is effective to use semiconductor chips 1 having a plurality of external terminals formed at the central portion of the circuit-forming surface along the one side thereof.

In order that the leads having the same functions may be opposed to each other, furthermore, there may be fabricated two kinds of semiconductor devices having leads bent in different directions by reversely forming the leads.

In the foregoing, various emobdiments of the invention have been concretely described. It should, however, be noted that the present invention is in no way limited to the above-mentioned embodiments only, but can be modified in a variety of other ways without departing from the spirit and scope of the invention.

For example, the invention can be applied to a semiconductor device of the SIP (Single In-line Package) type having a unidirectional lead arrangement structure, a semiconductor device of the ZIP (Zigzag In-like Package) type, and like devices.

The invention can be further applied to a semiconductor device of the SOJ (Small Out-line J-leaded lead package) type having a bidirectional lead arrangement structure, a semiconductor device of the SOP (Small Out-line Package) type, and like devices.

The invention can be further applied to a semiconductor device of the QFP (Qud Flatpack Package) type having a quater-directional lead arrangement structure, a semiconductor device of the QFJ (Quad Flatpack J-leaded Package) type, and like devices.

What is claimed is:

1. A semiconductor device comprising:

a first DRAM chip and a second DRAM chip, each having a main surface of a rectangular shape and a rear surface which is opposite to said main surface, and a plurality of external terminals arranged on said main surface, said main surface having a pair of longer edges extending in a first direction and a pair of shorter edges extending in a second direction substantially perpendicular to said first direction, said plurality of external terminals extending in said first direction and being arranged at a substantially central position between said pair of longer edges, said first and second DRAM chips being stacked on each other in such a manner that said rear surfaces of said first and second DRAM chips are adhered to each other with an adhesive agent, a plurality of first leads crossing said one of said pair of longer edges of said main surface of said first DRAM chip, each of said first leads having a first portion disposed on said main surface of said first DRAM chip, a second portion bending from said first portion toward said rear surface, and a third portion bending from said second portion in a direction away from an outer side of said first DRAM chip; and a plurality of second leads crossing the other of said pair of longer edges of said main surface of said first DRAM chip, each of said second leads having a first portion disposed on said main surface of said first DRAM chip, a second portion bending from said first portion toward said rear surface, and a third portion bending from said second portion in a direction away from the outer side of said first DRAM chip;

wherein said first portions of said first and second leads are electrically connected to corresponding external terminals of said plurality of external terminals of said first DRAM chip by first wires, respectively;

a plurality of third leads crossing said one of said pair of longer edges of said main surface of said second DRAM chip, each of said third leads having a first portion disposed on said main surface of said second DRAM chip, a second portion bending from said first portion toward said rear surface, and a third portion bending from said second portion in a direction away from an outer side of said second DRAM chip;

a plurality of fourth leads crossing the other of said pair of longer edges of said main surface of said second DRAM chip, each of said fourth lead having a first portion disposed on said main surface of said second DRAM chip, a second portion bending from said first portion toward said rear surface, and a third portion bending from said second portion in a direction away from the outer side of said second DRAM chip;

wherein said first portions of said third and fourth leads are electrically connected to corresponding external terminals of said plurality of external terminals of said second DRAM chip by second wires, respectively; and a resin mold sealing said first and second DRAM chips, said first and second wires, and a portion of each of said first to fourth leads, wherein said first and second leads are formed from a first lead frame and said third and fourth leads are formed from a second lead frame, different from the first lead frame, wherein said plurality of first and fourth leads are electrically connected to each other such that a back surface of said third portion of each of said first leads is mated with a back surface of said third portion of a corresponding one of said fourth leads, wherein said plurality of second and third leads are electrically connected to each other such that a back surface of said third portion of each of said second leads is mated with a back surface of said third portion of a corresponding one of said third leads, and wherein each of said first portions of said first to fourth leads has a thickness thinner than a thickness of at least one of said second and third portions, respectively, in a thickness direction of said first and second semiconductor chips.

2. A semiconductor device according to claim 1, further comprising first to fourth insulating adhesive films, and wherein said first to fourth insulating adhesive films are disposed between said first portions of said first to fourth leads and said main surfaces of said first and second semiconductor chips, respectively.

3. A semiconductor device according to clam 2, wherein each of said first to fourth insulating adhesive films includes a base insulating film and adhesive layers on both sides of said base insulating film.

4. A semiconductor device according to claim 3, wherein said third portion of each of said first and second leads is longer than said third portion of each of said third and fourth leads, and wherein said third portions of each of said first and second leads are protruded from said resin mold and form outer leads protruding outwardly from said resin mold.

5. A semiconductor device according to claim 4, wherein said third portion of said fourth lead is terminated substantially halfway through said third portion of said first lead, and wherein said third portion of said third lead is terminated substantially halfway through said third portion of said second lead.

6. A semiconductor device according to claim 5, wherein said first and fourth leads overlap each other in a plane view, and said second and third leads overlap each other in said plane view.

7. A semiconductor device according to claim 4, wherein said outer leads of first and said second leads have a gull-wing shape.

8. A semiconductor device comprising:
a first DRAM chip and a second DRAM chip, each having a main surface of a rectangular shape and a rear surface which is opposite to said main surface, and a plurality of external terminals arranged on said main surface, said main surface having a pair of longer edges extending in a first direction and a pair of shorter edges extending in a second direction substantially perpendicular to said first direction, said plurality of external terminals extending in said first direction and being arranged at a substantially central position between said pair of longer edges, said first and second DRAM chips being stacked on each other in such a manner that said rear surfaces of said first and second DRAM chips are adhered to each other with an adhesive agent,
a plurality of leads crossing said one of said pair of longer edges of said main surface of said first DRAM chip, each of said leads having a first portion disposed on said main surface of said first DRAM chip, a second portion bending from said first portion toward said rear surface, and a third portion bending from said second portion in a direction away from an outer side of said first DRAM chip; and
a resin mold sealing said first and second DRAM chips and a portion of said leads;
wherein said third portion of said leads are protruded from said resin mold and form outer leads protruding outwardly from said resin mold, and wherein said outer leads have a gull-wing shape.

* * * * *